(12) United States Patent
Galy et al.

(10) Patent No.: US 11,920,989 B2
(45) Date of Patent: Mar. 5, 2024

(54) THERMAL SENSOR CIRCUIT

(71) Applicant: STMicroelectronics SA, Montrouge (FR)

(72) Inventors: Philippe Galy, Le Touvet (FR); Renan Lethiecq, Bernin (FR)

(73) Assignee: STMicroelectronics SA, Montrouge (FR)

( * ) Notice: Subject to any disclaimer, the term of this patent is extended or adjusted under 35 U.S.C. 154(b) by 528 days.

(21) Appl. No.: 17/192,425

(22) Filed: Mar. 4, 2021

(65) Prior Publication Data
US 2021/0278288 A1 Sep. 9, 2021

Related U.S. Application Data

(60) Provisional application No. 62/985,992, filed on Mar. 6, 2020.

(51) Int. Cl.
| | |
|---|---|
| *G01K 7/01* | (2006.01) |
| *G01K 7/22* | (2006.01) |
| *G01K 7/25* | (2006.01) |
| *G05F 3/24* | (2006.01) |
| *H01C 7/00* | (2006.01) |
| *H01C 7/04* | (2006.01) |
| *H01L 27/12* | (2006.01) |
| *H01L 29/10* | (2006.01) |
| *H01L 29/78* | (2006.01) |

(52) U.S. Cl.
CPC ............... *G01K 7/01* (2013.01); *G01K 7/015* (2013.01); *G01K 7/22* (2013.01); *G01K 7/226* (2013.01); *G01K 7/25* (2013.01); *G05F 3/245* (2013.01); *H01C 7/008* (2013.01); *H01C 7/04* (2013.01); *H01L 27/1203* (2013.01); *H01L 29/1095* (2013.01); *H01L 29/7831* (2013.01)

(58) Field of Classification Search
CPC ........................................................ G01K 7/01
USPC ........................................................ 327/512
See application file for complete search history.

(56) References Cited

U.S. PATENT DOCUMENTS

| | | | |
|---|---|---|---|
| 5,279,162 A | 1/1994 | Takebe et al. | |
| 6,687,175 B1 | 2/2004 | Mizuno et al. | |
| 7,436,722 B2 | 10/2008 | Mizuno et al. | |
| 8,564,275 B2 | 10/2013 | Seok et al. | |
| 9,004,756 B2 | 4/2015 | John et al. | |
| 9,293,215 B2 | 3/2016 | Yoo et al. | |
| 9,466,536 B2 | 10/2016 | Goktepeli et al. | |
| 10,795,396 B2 * | 10/2020 | Lethiecq | G05F 3/245 |
| 2006/0066383 A1 | 3/2006 | Groiss | |
| 2008/0284493 A1 * | 11/2008 | Baek | G05F 3/30 327/513 |
| 2009/0285261 A1 | 11/2009 | Casey et al. | |

(Continued)

FOREIGN PATENT DOCUMENTS

| | | |
|---|---|---|
| JP | S56105682 A | 8/1981 |
| WO | 2005078729 A2 | 8/2005 |

*Primary Examiner* — Tomi Skibinski
(74) *Attorney, Agent, or Firm* — Crowe & Dunlevy

(57) ABSTRACT

An electronic device includes a module that delivers a positive temperature coefficient output voltage at an output terminal. A thermistor includes a first MOS transistor operating in weak inversion mode and having a negative temperature coefficient drain-source resistance and whose source is coupled to the output terminal. A current source coupled to the output terminal operates to impose the drain-source current of the first transistor.

22 Claims, 16 Drawing Sheets

(56) References Cited

U.S. PATENT DOCUMENTS

2011/0155913 A1 6/2011 Noguchi et al.
2012/0181430 A1 7/2012 Noguchi et al.
2014/0342529 A1 11/2014 Goktepeli et al.

* cited by examiner

THERMAL SENSOR CIRCUIT

CROSS-REFERENCE TO RELATED APPLICATION

This application claims priority from U.S. Provisional Application for Patent No. 62/985,992, filed Mar. 6, 2020, the disclosure of which is incorporated by reference.

TECHNICAL FIELD

Embodiments relate to electronic devices and, in particular, to a thermal sensor circuit implemented as an integrated electronic circuit supported by a bulk semiconductor substrate, a partially depleted semiconductor on insulator (PD-SOI) substrate, or a fully depleted semiconductor on insulator (FD-SOI).

BACKGROUND

Reference is made to FIG. 1 showing a circuit diagram for an embodiment of a temperature sensing circuit module 3 as taught by U.S. patent application Ser. No. 16/572,130 (incorporated by reference). The circuit module 3 includes: a thermistor 4 and a current source 5. The thermistor 4 is formed by a first MOS transistor T1 (comprising, for example, an NMOS transistor) having a source S1 that is coupled to an output terminal BS of the circuit module 3 and a drain D1 and a gate G1 that are electrically shorted to each other and coupled to a supply voltage VDD. The current source 5 is formed by a second MOS transistor T2 (comprising, for example, an NMOS transistor) having a gate G2 that is coupled to the output terminal BS (and thus to the source S1) and a drain D2 and a source S2 that are each coupled to a ground voltage GND.

The transistors T1 and T2 are each supported by a semiconductor on insulator (SOI) substrate (FIG. 1A), and thus the first MOS transistor T1 further includes a back gate B1 and the second MOS transistor T2 further includes a back gate B2. As understood by those skilled in the art, an SOI substrate is formed, for example, by semiconductor (for example, silicon) film layer that is insulated from a semiconductor (for example, silicon) support layer by an insulating layer (typically referred to in the art as a buried oxide (BOX) layer). The sources S1, S2 and drains D1, D2 are formed by doped regions in the semiconductor film layer and the back gates B1 and B2 are formed by doped portions of the semiconductor support layer located underneath the channel region of the transistor.

In particular, the semiconductor on insulator (SOI) used to support the first and second transistors T1, T2 of the module 3 includes a semiconductor film layer that is of the fully depleted type. Fully depleted semiconductor on insulator (FD-SOI) is a planar process technology that relies on two innovations. The first innovation concerns the use of a very thin BOX layer (for example, with a thickness in the range of 5-50 nm). The second innovation concerns the use of a very thin semiconductor film layer (for example, with a thickness in the range of 5-20 nm). With this configuration, the depletion region can cover the whole thickness of the semiconductor film layer because the semiconductor material for the semiconductor film layer is undoped (intrinsic) or very lightly doped and there are no (or very few) mobile charges in the channel region of the transistor.

The back gates B1, B2 of the first and second transistors T1, T2, respectively, are coupled to the ground supply voltage GND and are not used to control the operation of the first and second transistors T1 and T2.

The voltage at the supply voltage VDD may, for example, be about 1.0V (and in particular may be 0.9V for the FD-SOI implementation), so that the first transistor T1 is in weak inversion mode, that is to say having a gate-source voltage lower than its threshold voltage.

In this case, the output voltage Vout at the output terminal BS, in other words the gate voltage Vg2 of the second transistor T2, is variable between 0.6 V and 0.95 V, thereby allowing operation of the second transistor T2 in strong inversion mode, that is to say having a gate-source voltage higher than its threshold voltage.

In an alternative implementation shown by dotted lines, the drain D2 of the second transistor T2 may instead be coupled to a supply (bias) voltage, (for example, 1.0V) instead of to the ground voltage GND. This implementation is made at the expense of an increase in the power consumption of the second transistor T2, and thus may be undesirable in some circuit implementations.

As the second transistor T2 is operating in strong inversion mode, there is a gate leakage current Ig2 of the second transistor T2 that imposes the drain-source current Ids1 of the first transistor T1. The orders of magnitude of the gate leakage current Ig2 and of the drain-source current Ids1 of the first transistor T1 are substantially equal. By way of indication, these leakage currents are of the order of about one hundred picoamperes.

To this end, the thickness of the gate oxide of the second transistor T2 is relatively thin and is preferably less than 2 nm.

FIG. 2 illustrates operation of the module 3 as a function of the temperature, within a range between −150° C. and 200° C., and with VDD=0.9V to 1.0V. The curve CB1 shows results of a SPICE ("Simulation Program with Integrated Circuit Emphasis") simulation of the module 3 as a function of the temperature, within a range between −150° C. and 200° C. The curve CB2 shows results for implementation of the module 3 at the technology node 28 FD-SOI (characterized, for example, by a 28 nm process with a high-k metal gate and ultra-thin box and body (UTBB) substrate with a thin (for example, 1.5 nm equivalent oxide thickness (EOT)) oxide front gate and epitaxial raised source/drain structures).

As is seen from the curves CB1 and CB2 of FIG. 2, the output voltage Vout varies proportionally to the temperature. For example, the output voltage Vout for curve CB1 varies substantially linearly between 0.6V and 0.95V (for VDD=1.0V). Similarly, the output voltage Vout for curve CB2 varies substantially linearly between 0.5V and 0.85V (for VDD=0.9V). Thus, the module 3 forms an accurate and useful temperature sensing circuit, with the output voltage at node BS having a value proportional to temperature (i.e., the output voltage has a positive temperature coefficient).

It has been noted, however, that similar substantially linear curves for output voltage versus temperature are not necessarily obtained when the circuit module 3 is extended to other technology nodes (including different substrate types).

For example, consider an extension to fabrication of the circuit module for a bulk semiconductor substrate technology node. FIG. 3 shows a circuit diagram for an embodiment of a temperature sensing circuit module 3a. The first MOS transistor T1 forming the thermistor 4 has a source S1 that is coupled to the output terminal BS of the circuit module 3 and a drain D1 and a gate G1 that are electrically shorted to each other and coupled to the supply voltage VDD. The second MOS transistor T2 forming the current source 5 has a gate G2 that is coupled to the output terminal BS (and thus to the source S1) and a drain D2 and a source S2 that are each coupled to the ground voltage GND. The transistors T1 and T2 are each supported by a bulk semiconductor (for example, silicon) substrate as shown in FIG. 3A. In this implementation, there are no back gates for the transistors T1 and T2, and the body (bulk) of the transistor T1 is tied to the source S1 of transistor T1 and the body (bulk) of the transistor T2 is either electrically tied to the ground voltage GND or tied to the source S2 of transistor T2.

In an alternative implementation shown by dotted lines, the drain D2 of the second transistor T2 may instead be coupled to a supply (bias) voltage, (for example, 1.0V) instead of to the ground voltage GND. This implementation is made at the expense of an increase in the power consumption of the second transistor T2, and thus may be undesirable in some circuit implementations.

FIG. 4 illustrates operation of the module 3a as a function of the temperature, within a range between −150° C. and 200° C. The curve CB3 shows results for implementation of the module 3a at the technology node 40 bulk (characterized, for example, by a 40 nm process with a polysilicon gate having a thin (for example, 1.7 nm) dimension with VDD=1.1V). The curve CB4 shows results for implementation of the module 3a at the technology node 65 bulk (characterized, for example, by a 40 nm process with a polysilicon gate having a thin (for example, 1.8 nm) dimension with VDD=1.2V). The curve CB2 which shows results for implementation of the module 3 at the technology node 28 FD-SOI, with VDD=0.9V, is provided for comparison purposes. It will be noted that there is significant linearity degradation for the module 3a especially in the temperature range from −40 to +125° C.

As a further example, consider an extension to fabrication of the circuit module for a partially depleted semiconductor on insulator (PD-SOI) substrate technology node. Figure shows a circuit diagram for an embodiment of a temperature sensing circuit module 3b1. The first MOS transistor T1 forming the thermistor 4 has a source S1 that is coupled to the output terminal BS of the circuit module 3 and a drain D1 and a gate G1 that are electrically shorted to each other and coupled to the supply voltage VDD. The second MOS transistor T2 forming the current source 5 has a gate G2 that is coupled to the output terminal BS (and thus to the source S1) and a drain D2 and a source S2 that are each coupled to the ground voltage GND.

The transistors T1 and T2 are each supported by a partially depleted semiconductor on insulator (FD-SOI) substrate. PD-SOI is a planar process technology that is generally structurally similar to FD-SOI, but differs in that both the BOX layer and semiconductor film layer are thicker. With this configuration, the depletion region will not cover the whole thickness of the semiconductor film layer. The semiconductor material for the semiconductor film layer in PD-SOI is also typically lightly doped. Preferably, the semiconductor film layer has a thickness that is not too great so as to avoid memory effects, for example a thickness close to that of the semiconductor film of the FD-SOI substrate.

In this implementation, the back gates B1 and B2 for the transistors T1 and T2, respectively, are electrically connected to the ground voltage GND. The body (i.e., the channel region of the semiconductor film layer) of the transistor T1 and the body (i.e., the channel region of the semiconductor film layer) of the transistor T2 are both left floating (i.e., the body region of the substrate is not electrically connected to a bias voltage or to a transistor source). This implementation is essentially the same as the implementation for module 3 of FIG. 1.

In an alternative implementation shown by dotted lines, the drain D2 of the second transistor T2 may instead be coupled to a supply (bias) voltage, (for example, 1.0V) instead of to the ground voltage GND. This implementation is made at the expense of an increase in the power consumption of the second transistor T2, and thus may be undesirable in some circuit implementations.

FIG. 6A illustrates operation of the module 3b1 as a function of the temperature, within a range between −150° C. and 200° C., with VDD=1.2V. The curve CB5-1 shows results for implementation of the module 3b1 at the technology node H9 SOI (characterized, for example, by a 130 nm process with a polysilicon gate having a thin (for example, 2 nm) dimension). The curve CB6-1 shows results for implementation of the module 3b1 at the technology node 65 SOI (characterized, for example, by a 65 nm process with a polysilicon gate having a thin (for example, 1.8 nm) dimension). The curve CB2 which shows results for implementation of the module 3 at the technology node 28 FD-SOI, with VDD=0.9V, is provided for comparison. It will be noted that there is significant linearity degradation for the module 3b1 especially in the temperature range from −40 to +125° C.

FIG. 5B shows a circuit diagram for an embodiment of a temperature sensing circuit module 3b2. The first MOS transistor T1 forming the thermistor 4 has a source S1 that is coupled to the output terminal BS of the circuit module 3 and a drain D1 and a gate G1 that are electrically shorted to each other and coupled to the supply voltage VDD. The second MOS transistor T2 forming the current source 5 has a gate G2 that is coupled to the output terminal BS (and thus to the source S1) and a drain D2 and a source S2 that are each coupled to the ground voltage GND. The transistors T1 and T2 are each supported by a PD-SOI substrate. In this implementation, the back gates B1 and B2 for the transistors T1 and T2, respectively, are electrically connected to the ground voltage GND. The body (i.e., the channel region of the semiconductor film layer) of the transistor T1 is tied to the source S1 of the transistor T1. The body (i.e., the channel region of the semiconductor film layer) of the transistor T2 is electrically connected to the ground voltage GND.

In an alternative implementation shown by dotted lines, the drain D2 of the second transistor T2 may instead be coupled to a supply (bias) voltage, (for example, 1.0V) instead of to the ground voltage GND. This implementation is made at the expense of an increase in the power consumption of the second transistor T2, and thus may be undesirable in some circuit implementations.

FIG. 6B illustrates operation of the module 3b2 as a function of the temperature, within a range between −150° C. and 200° C., with VDD=1.2V. The curve CB5-2 shows results for implementation of the module 3b2 at the technology node H9 SOI. The curve CB6-2 shows results for implementation of the module 3b2 at the technology node 65 SOI. The curve CB2 which shows results for implementation of the module 3 at the technology node 28 FD-SOI is provided for comparison. It will be noted that there is significant linearity degradation for the module 3b2 especially in the temperature range from −40 to +125° C. There is accordingly a need in the art to address the issue of variation in output voltage versus temperature performance of the circuit module 3 when extended across technology nodes.

SUMMARY

An embodiment of a temperature sensor includes: a thermistor formed by at least a first MOS transistor configured to operate in weak inversion mode and have a negative temperature coefficient drain-source resistance. The source of the first MOS transistor is coupled to an output terminal. A current source formed by a second MOS transistor has a control terminal coupled to the source of the first MOS transistor. The second MOS transistor is configured to operate in strong inversion mode and have a gate leakage current which imposes the drain-source current of the first MOS transistor. The gate leakage current is of the same order of magnitude as the drain-source current of the first MOS transistor.

When the first MOS transistor operates in weak inversion mode, also known to those skilled in the art as operating in sub-threshold mode, the gate voltage of the MOS first transistor is lower than the threshold voltage of the first transistor, and is biased with a fixed drain-source voltage. The drain-source current output by the first MOS transistor has a positive temperature coefficient (i.e., the drain-source resistance of the first MOS transistor has a negative temperature coefficient, and thus decreases as the temperature increases). With the drain voltage of the first transistor fixed and with the drain-source current imposed by the second MOS transistor, the drain-source voltage of the first MOS transistor, which is equal to the product of the drain-source current and the drain-source resistance, decreases as the temperature increases. As a result, the source voltage of the first transistor, in other words the voltage at the output terminal, increases as the temperature increases, and therefore has a positive temperature coefficient.

Advantageously, such a temperature-sensitive module comprising two MOS transistors (and perhaps a third MOS transistor in an alternative embodiment) has a compact structure. Furthermore, because the thermistor is operating in weak inversion mode, the drain-source current of the first MOS transistor (and third MOS transistor coupled in series therewith) is very low, and the power consumption of the temperature-sensitive module is therefore advantageously low.

The first and second MOS transistors may, for example, be NMOS transistors. The third MOS transistor may also be an NMOS transistor.

By way of non-limiting example, the temperature sensor may be produced in an integrated manner.

The temperature sensor may, for example, be produced on a bulk substrate or a silicon-on-insulator substrate. When said substrate is a silicon-on-insulator substrate, the silicon-on-insulator substrate may, for example, be a fully or partially depleted silicon-on-insulator substrate.

The temperature sensor may, for example, be a circuit component of functional circuitry for an electronic device, such as a cellular mobile telephone, tablet or laptop computer.

In an embodiment, a temperature sensing circuit comprises: a thermistor comprising a first MOS transistor having a first drain, a first source, a first gate and a first body, wherein the first MOS transistor is configured to operate in weak inversion mode with a negative temperature coefficient drain-source resistance; an output terminal coupled to the first source and configured to generate a positive temperature coefficient output voltage; and a current source comprising a second MOS transistor having a second drain, a second source, a second gate and a second body, wherein the second gate is coupled to the first source and configured to impose a drain-source current of the first MOS transistor; and wherein the first body and second body are directly electrically connected to a ground node.

In an embodiment, a temperature sensing circuit comprises: a thermistor comprising a first MOS transistor having a first drain, a first source, a first gate, a first body and a first back gate, wherein the first MOS transistor is configured to operate in weak inversion mode with a negative temperature coefficient drain-source resistance; an output terminal coupled to the first source and configured to generate a positive temperature coefficient output voltage; and a current source comprising a second MOS transistor having a second drain, a second source, a second gate, a second body and a second back gate, wherein the second gate is coupled to the first source and configured to impose a drain-source current of the first MOS transistor; and wherein the first body and second body are floating, and wherein the first back gate and the second back gate are directly electrically connected to a ground node.

In an embodiment, a temperature sensing circuit comprises: a thermistor comprising a first MOS transistor having a first drain, a first source, a first gate and a first body, wherein the first MOS transistor is configured to operate in weak inversion mode with a negative temperature coefficient drain-source resistance; an output terminal coupled to the first source and configured to generate a positive temperature coefficient output voltage; a current source comprising a second MOS transistor having a second drain, a second source, a second gate and a second body, wherein the second gate is coupled to the first source and configured to impose a drain-source current of the first MOS transistor; a bias voltage generator configured to generate a bias voltage; and wherein the first body is configured to receive the bias voltage, and wherein the second body is directly electrically connected to a ground node.

BRIEF DESCRIPTION OF THE DRAWINGS

Other advantages and features of the invention will become apparent upon examining the detailed description of completely non-limiting embodiments and the appended drawings, in which.

DETAILED DESCRIPTION

Figure 3:
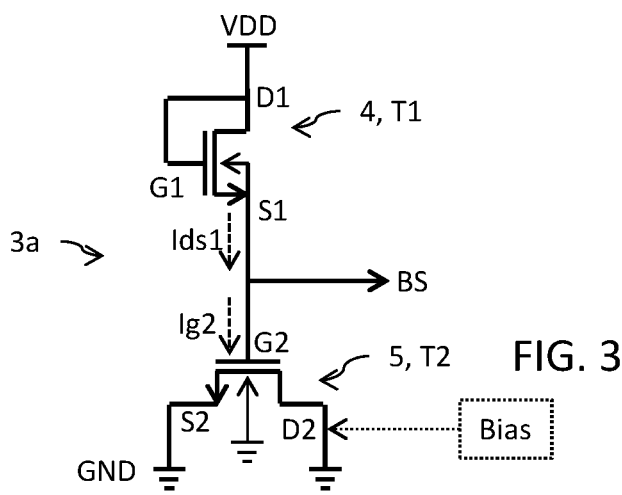
FIG. 3 is a circuit diagram for an embodiment of a temperature sensing circuit module.
Figure 3A:
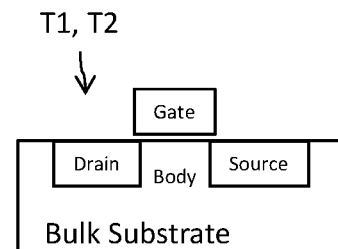
FIG. 3A generally shows a bulk substrate supporting a MOS transistor.
Figure 4:
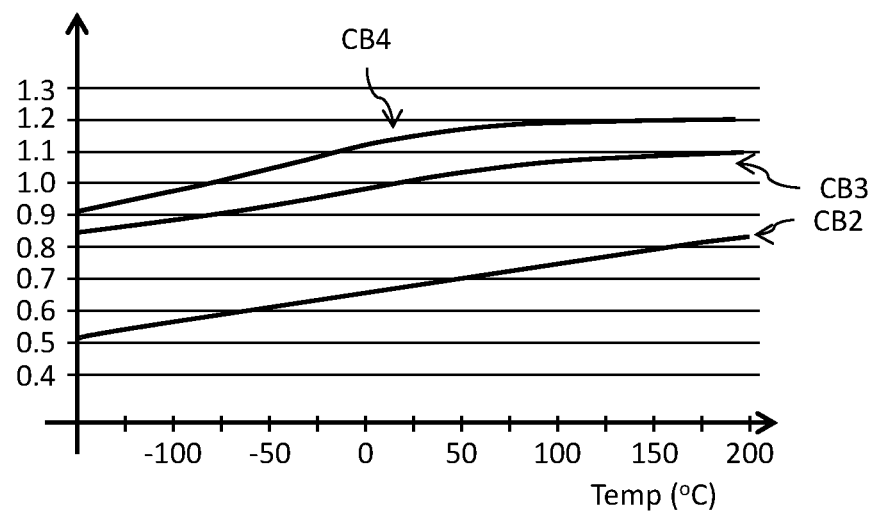
FIG. 4 illustrates operation of the temperature sensing circuit module of FIG. 3 as a function of voltage versus temperature.
Figure 5A:
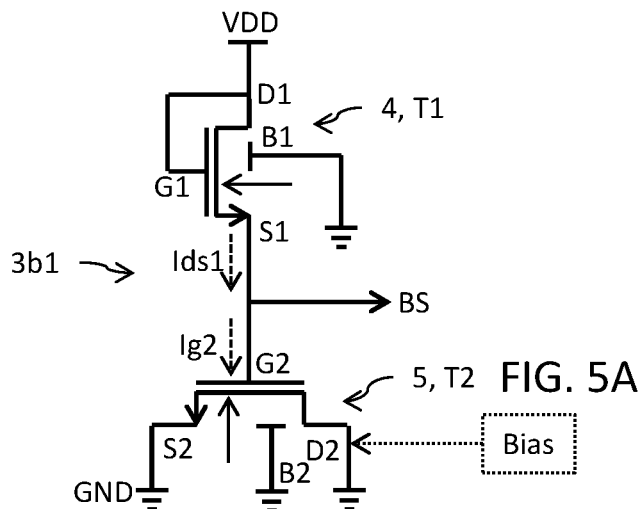
FIG. 5A is a circuit diagram for an embodiment of a temperature sensing circuit module.
Figure 6A:
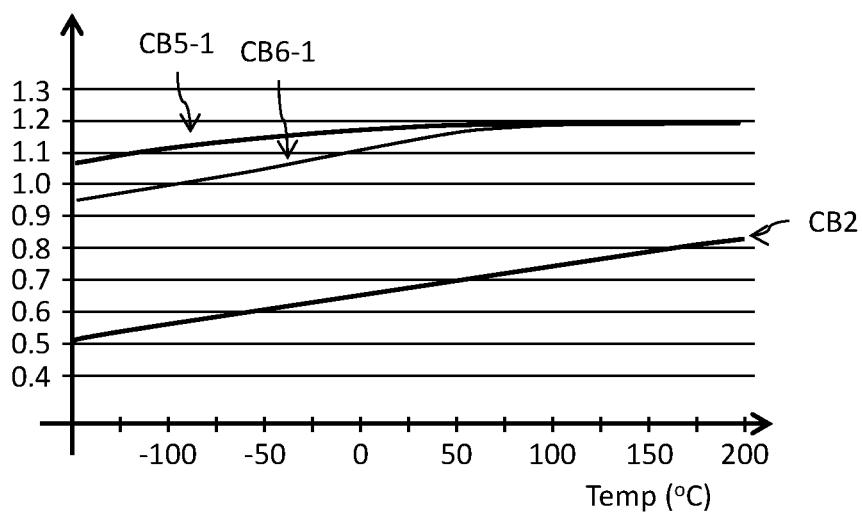
FIG. 6A illustrates operation of the temperature sensing circuit module of FIG. 5A as a function of voltage versus temperature.
Figure 5B:
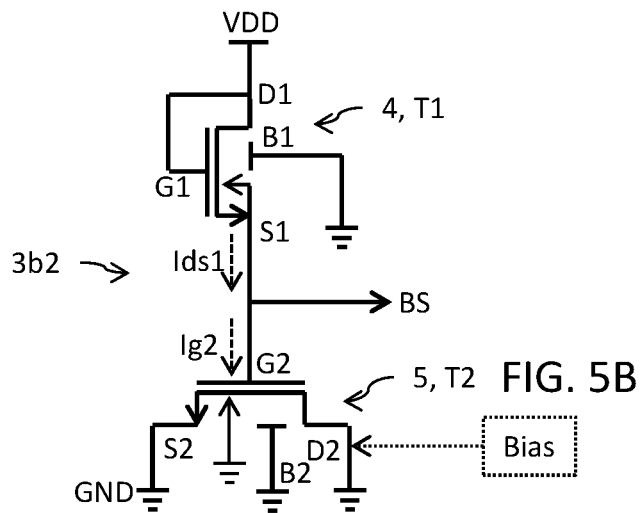
FIG. 5B is a circuit diagram for an embodiment of a temperature sensing circuit module.
Figure 6B:
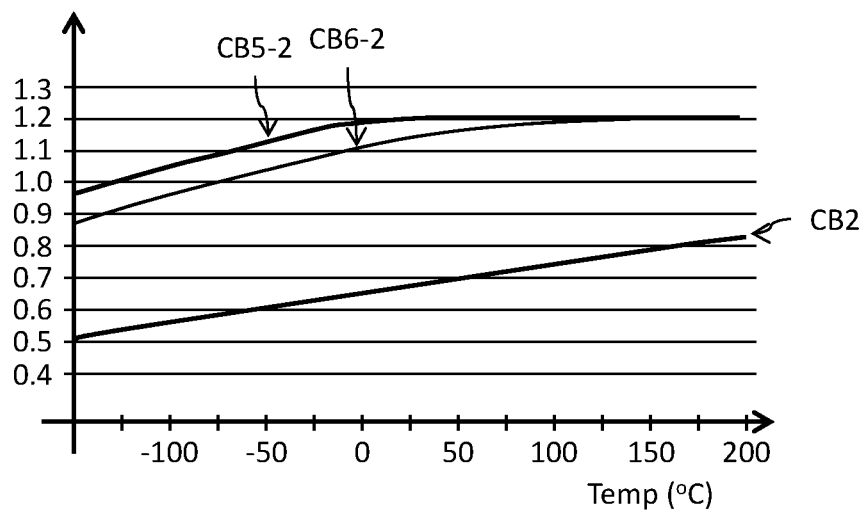
FIG. 6B illustrates operation of the temperature sensing circuit module of FIG. 5B as a function of voltage versus temperature.
Figure 7:
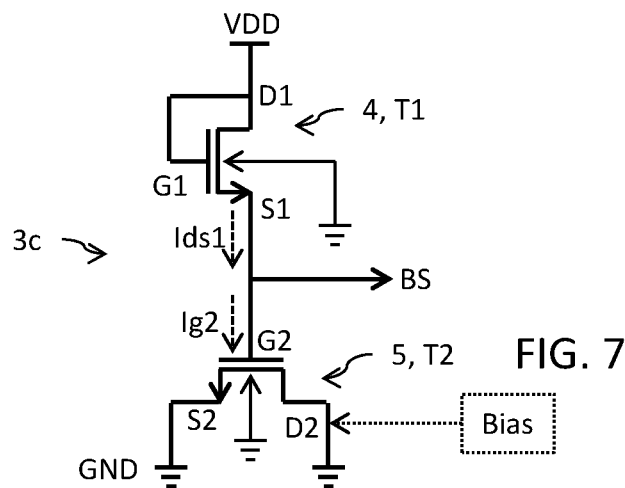
FIG. 7 is a circuit diagram for an embodiment of a temperature sensing circuit module.

In connection with fabrication of the circuit module for a bulk semiconductor substrate technology node, FIG. 7 shows a circuit diagram for an embodiment of a temperature sensing circuit module 3c. The first MOS transistor T1 forming the thermistor 4 has a source S1 that is coupled to the output terminal BS of the circuit module 3 and a drain D1 and a gate G1 that are electrically shorted to each other and coupled to the supply voltage VDD. The second MOS transistor T2 forming the current source 5 has a gate G2 that is coupled to the output terminal BS (and thus to the source S1) and a drain D2 and a source S2 that are each coupled to the ground voltage GND. The transistors T1 and T2 are each supported by a bulk semiconductor (for example, silicon) substrate (see, FIG. 3A). In this implementation, there are no back gates for the transistors T1 and T2. The body (bulk) of the transistor T1 is directly electrically connected to the ground voltage GND and the body (bulk) of the transistor T2 is also directly electrically connected to the ground voltage GND.

In an alternative implementation shown by dotted lines, the drain D2 of the second transistor T2 may instead be coupled to a supply (bias) voltage, (for example, 1.0V) instead of to the ground voltage GND. This implementation is made at the expense of an increase in the power consumption of the second transistor T2, and thus may be undesirable in some circuit implementations.

Figure 8:
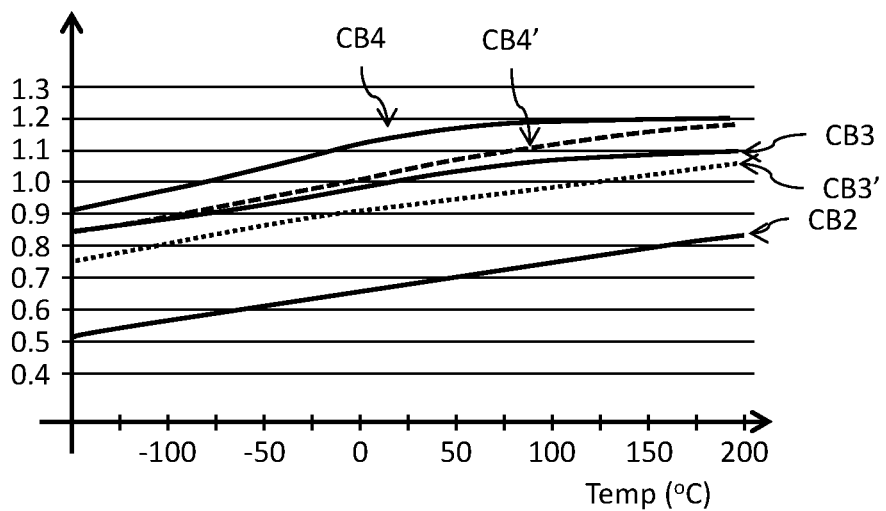
FIG. 8 illustrates operation of the temperature sensing circuit module of FIG. 7 as a function of voltage versus temperature.

FIG. 8 illustrates operation of the module 3c as a function of the temperature, within a range between −150° C. and 200° C. The curve CB3' shows results for implementation of the module 3c at the technology node 40 bulk, with VDD=1.1V. The curve CB4' shows results for implementation of the module 3c at the technology node 65 bulk, with VDD=1.2V. For comparison purposes, the curve CB2 for module 3 and the curves CB3 and CB4 for module 3a are also shown. It will be noted that there is some improvement in linearity, especially for the module 3c fabricated at the technology node 40 bulk, but linearity degradation nonetheless persists over some temperature ranges. The module 3c is accordingly an improvement over the module 3a and is useful in some device applications.

Figure 1:
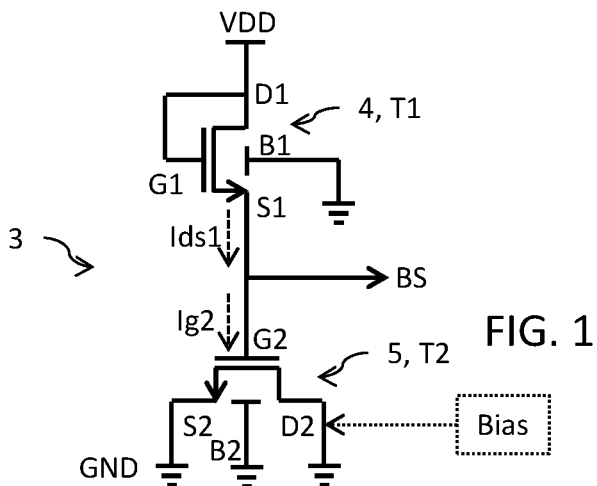
FIG. 1 is a circuit diagram for an embodiment of a temperature sensing circuit module.
Figure 1A:
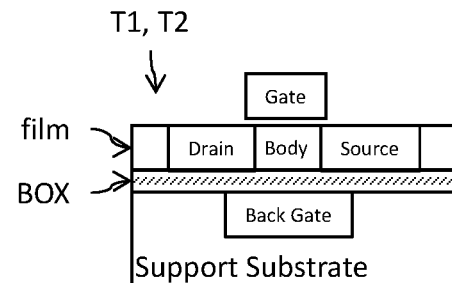
FIG. 1A generally shows a semiconductor on insulator (SOI) substrate supporting a MO S transistor.
Figure 2:
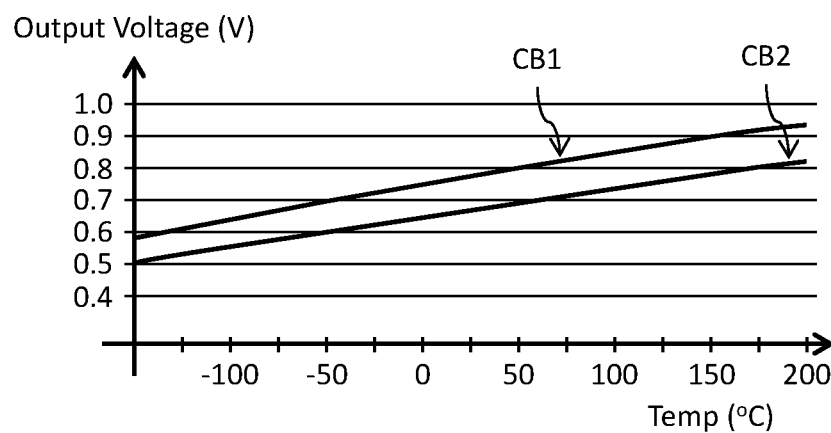
FIG. 2 illustrates operation of the temperature sensing circuit module of FIG. 1 as a function of voltage versus temperature.
Figure 9:
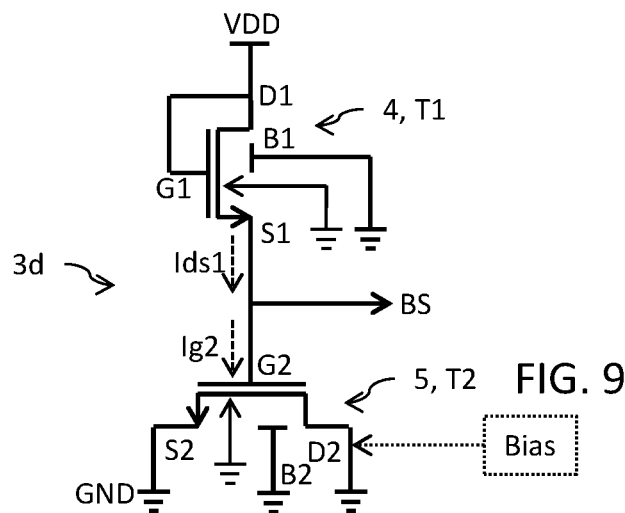
FIG. 9 is a circuit diagram for an embodiment of a temperature sensing circuit module.

In connection with fabrication of the circuit module for a partially depleted semiconductor on insulator (PD-SOI) substrate technology node, FIG. 9 shows a circuit diagram for an embodiment of a temperature sensing circuit module 3d. The first MOS transistor T1 forming the thermistor 4 has a source S1 that is coupled to the output terminal BS of the circuit module 3 and a drain D1 and a gate G1 that are electrically shorted to each other and coupled to the supply voltage VDD. The second MOS transistor T2 forming the current source 5 has a gate G2 that is coupled to the output terminal BS (and thus to the source S1) and a drain D2 and a source S2 that are each coupled to the ground voltage GND. The transistors T1 and T2 are each supported by a PD-SOI substrate (see, FIG. 1A). In this implementation, the back gates B1 and B2 for the transistors T1 and T2, respectively, are directly electrically connected to the ground voltage GND. Furthermore, the body (i.e., the channel region of the semiconductor film layer) of the transistor T1 and the body (i.e., the channel region of the semiconductor film layer) of the transistor T2 are also directly electrically connected to the ground voltage GND.

In an alternative implementation shown by dotted lines, the drain D2 of the second transistor T2 may instead be coupled to a supply (bias) voltage, (for example, 1.0V) instead of to the ground voltage GND. This implementation is made at the expense of an increase in the power consumption of the second transistor T2, and thus may be undesirable in some circuit implementations.

Figure 10A:
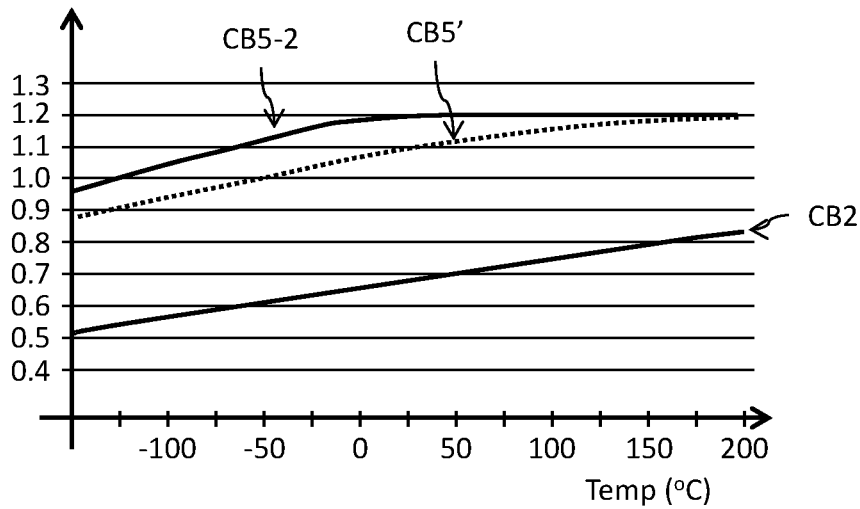
FIGS. 10A-10B illustrate operation of the temperature sensing circuit module of FIG. 9 as a function of voltage versus temperature.
Figure 10B:
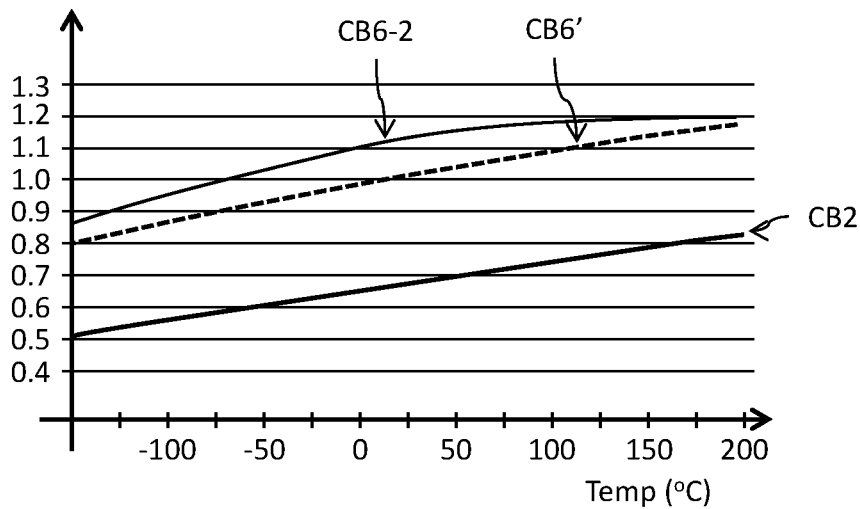

FIGS. 10A-10B illustrate operation of the module 3*d* as a function of the temperature, within a range between −150° C. and 200° C., with VDD=1.2V. The curve CB5' shows results for implementation of the module 3*d* at the technology node H9 SOI. The curve CB6' shows results for implementation of the module 3*d* at the technology node 65 SOI. For comparison purposes, the curve CB2 for the module 3 and the curves CB5-2 and CB6-2 for the module 3*b*2 are also shown. It will be noted that there is some improvement in linearity, but linearity degradation nonetheless persists over some temperature ranges. The module 3*d* is accordingly an improvement over the module 3*b*2 and is useful in some device applications.

Figure 11:
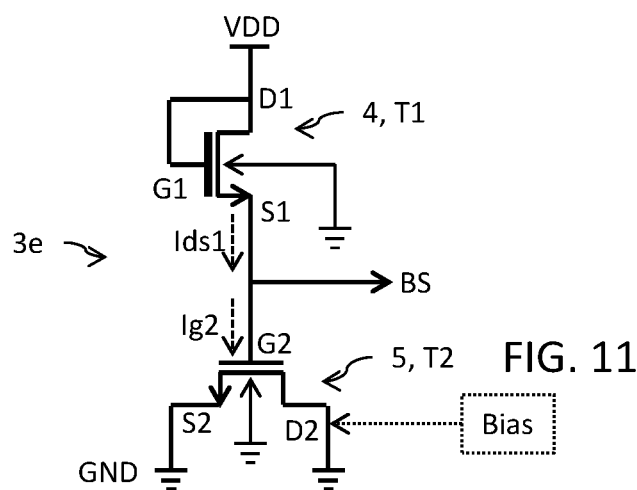
FIG. 11 is a circuit diagram for an embodiment of a temperature sensing circuit module.

In connection with fabrication of the circuit module for a bulk semiconductor substrate technology node, FIG. 11 shows a circuit diagram for an embodiment of a temperature sensing circuit module 3*e*. The first MOS transistor T1 forming the thermistor 4 has a source S1 that is coupled to the output terminal BS of the circuit module 3 and a drain D1 and a gate G1 that are electrically shorted to each other and coupled to the supply voltage VDD. The second MOS transistor T2 forming the current source 5 has a gate G2 that is coupled to the output terminal BS (and thus to the source S1) and a drain D2 and a source S2 that are each coupled to the ground voltage GND. The transistors T1 and T2 are each supported by a bulk semiconductor (for example, silicon) substrate (see, FIG. 3A). In this implementation, there are no back gates for the transistors T1 and T2. The body (bulk) of the transistor T1 is directly electrically connected to the ground voltage GND and the body (bulk) of the transistor T2 is also directly electrically connected to the ground voltage GND. Additionally, the transistor T1 is fabricated to have a thicker gate oxide. For example, the gate oxide of transistor T1 in the module 3*e* has a thickness of about 5 nm, while the gate oxide of transistor T1 in the module 3*c* has a thickness of 1.7-1.8 nm. Increasing the thickness of the gate oxide of transistor T1 has the effect of improving the gate-body (GB) and drain-body (DB) leakage and sub-threshold voltage performance.

In an alternative implementation shown by dotted lines, the drain D2 of the second transistor T2 may instead be coupled to a supply (bias) voltage, (for example, 1.0V) instead of to the ground voltage GND. This implementation is made at the expense of an increase in the power consumption of the second transistor T2, and thus may be undesirable in some circuit implementations.

Figure 12:
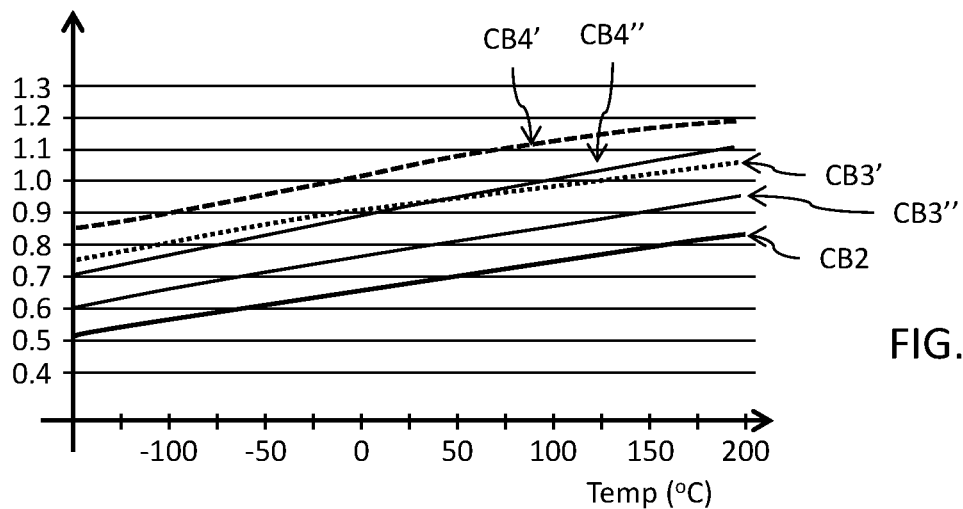
FIG. 12 illustrates operation of the temperature sensing circuit module of FIG. 11 as a function of voltage versus temperature.

FIG. 12 illustrates operation of the module 3*e* as a function of the temperature, within a range between −150° C. and 200° C. The curve CB3" shows results for implementation of the module 3*e* at the technology node 40 bulk, with VDD=1.1V. The curve CB4" shows results for implementation of the module 3*e* at the technology node 65 bulk, with VDD=1.2V. For comparison purposes, the curve CB2 for the module 3 and the curves CB3' and CB4' for the module 3*c* are also shown. It will be noted that there is some improvement in linearity, especially for the module 3*e* fabricated at the technology node 40 bulk, but linearity degradation nonetheless persists over some temperature ranges. The module 3*e* is accordingly an improvement over the module 3*c* and is useful in some device applications.

Figure 13:
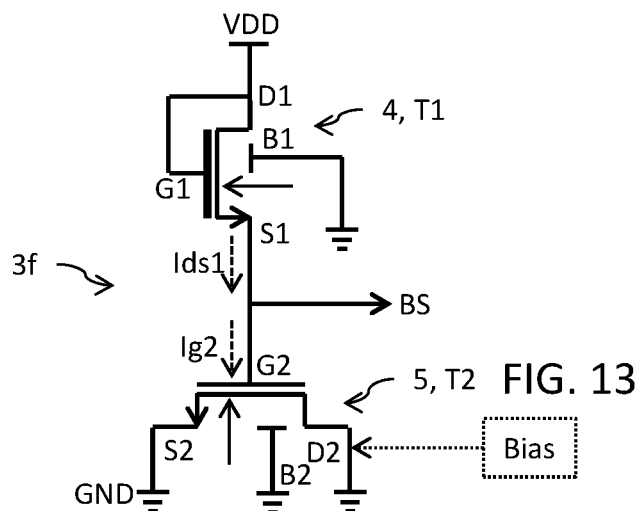
FIG. 13 is a circuit diagram for an embodiment of a temperature sensing circuit module.

In connection with fabrication of the circuit module for a fully depleted semiconductor on insulator (FD-SOI) substrate technology node, FIG. 13 shows a circuit diagram for an embodiment of a temperature sensing circuit module 3*f*. The first MOS transistor T1 forming the thermistor 4 has a source S1 that is coupled to the output terminal BS of the circuit module 3 and a drain D1 and a gate G1 that are electrically shorted to each other and coupled to the supply voltage VDD. The second MOS transistor T2 forming the current source 5 has a gate G2 that is coupled to the output terminal BS (and thus to the source S1) and a drain D2 and a source S2 that are each coupled to the ground voltage GND. The transistors T1 and T2 are each supported by a FD-SOI substrate (see, FIG. 1A). In this implementation, the back gates B1 and B2 for the transistors T1 and T2, respectively, are directly electrically connected to the ground voltage GND. Furthermore, the body (i.e., the channel region of the semiconductor film layer) of the transistor T1 and the body (i.e., the channel region of the semiconductor film layer) of the transistor T2 are left floating. In addition, the transistor T1 is fabricated to have a thicker gate oxide. For example, the gate oxide of transistor T1 in the module 3 has a thickness of about 1.5 nm, while the gate oxide of transistor T1 in the module 3*f* has a thickness of about 5 nm. Increasing the thickness of the gate oxide of transistor T1 has the effect of improving the gate-body (GB) and drain-body (DB) leakage and sub-threshold voltage performance.

In an alternative implementation shown by dotted lines, the drain D2 of the second transistor T2 may instead be coupled to a supply (bias) voltage, (for example, 1.0V) instead of to the ground voltage GND. This implementation is made at the expense of an increase in the power consumption of the second transistor T2, and thus may be undesirable in some circuit implementations.

Figure 14:
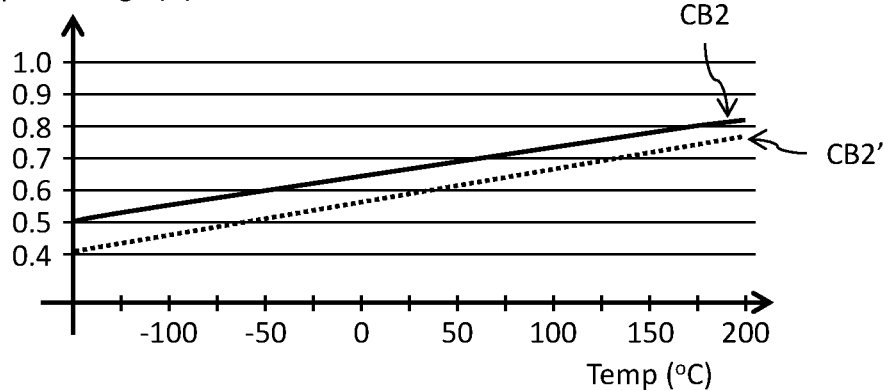
FIG. 14 illustrates operation of the temperature sensing circuit module of FIG. 13 as a function of voltage versus temperature.

FIG. 14 illustrates operation of the module 3*f* as a function of the temperature, within a range between −150° C. and 200° C., and VDD=0.9V. The curve CB2' shows results for implementation of the module 3*f* For comparison purposes, the curve CB2 for the operation of module 3 is also shown. It will be noted that module 3*f* exhibits substantially the same linearity with a slight improvement (i.e., increase) in slope. The module 3*f* is accordingly an improvement over the module 3.

Figure 15:
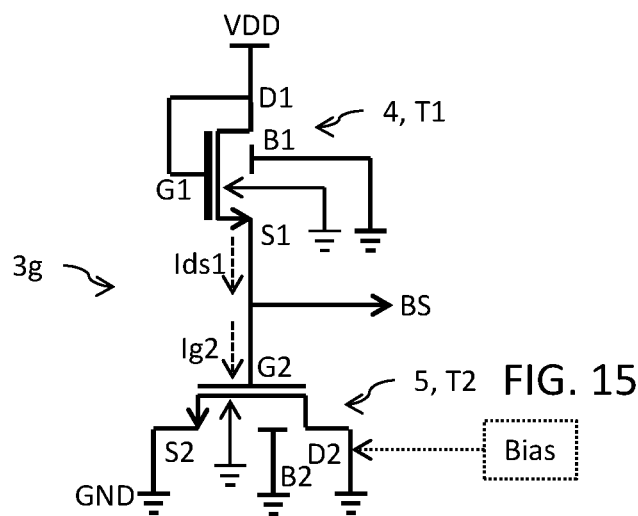
FIG. 15 is a circuit diagram for an embodiment of a temperature sensing circuit module.

In connection with fabrication of the circuit module for a partially depleted semiconductor on insulator (PD-SOI) substrate technology node, FIG. 15 shows a circuit diagram for an embodiment of a temperature sensing circuit module 3*g*. The first MOS transistor T1 forming the thermistor 4 has a source S1 that is coupled to the output terminal BS of the circuit module 3 and a drain D1 and a gate G1 that are electrically shorted to each other and coupled to the supply voltage VDD. The second MOS transistor T2 forming the current source 5 has a gate G2 that is coupled to the output terminal BS (and thus to the source S1) and a drain D2 and a source S2 that are each coupled to the ground voltage GND. The transistors T1 and T2 are each supported by a PD-SOI substrate (see, FIG. 1A). In this implementation, the back gates B1 and B2 for the transistors T1 and T2, respectively, are directly electrically connected to the ground voltage GND. Furthermore, the body (i.e., the channel region of the semiconductor film layer) of the transistor T1 and the body (i.e., the channel region of the semiconductor film layer) of the transistor T2 are also directly electrically connected to the ground voltage GND. In addition, the transistor T1 is fabricated to have a thicker gate oxide. For example, the gate oxide of transistor T1 in the module 3*g* has a thickness of about 5 nm, while the gate oxide of transistor T1 in the module 3*d* has a thickness of 1.8-2 nm. Increasing the thickness of the gate oxide of transistor T1 has the effect of improving the gate-body (GB) and drain-body (DB) leakage and sub-threshold voltage performance.

In an alternative implementation shown by dotted lines, the drain D2 of the second transistor T2 may instead be coupled to a supply (bias) voltage, (for example, 1.0V) instead of to the ground voltage GND. This implementation is made at the expense of an increase in the power consumption of the second transistor T2, and thus may be undesirable in some circuit implementations.

Figure 16A:
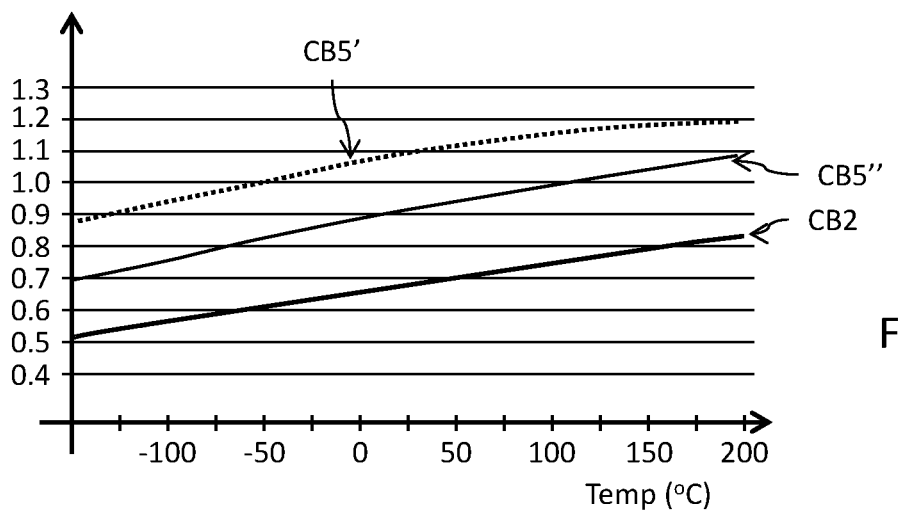
FIGS. 16A-16B illustrate operation of the temperature sensing circuit module of FIG. 15 as a function of voltage versus temperature.
Figure 16B:
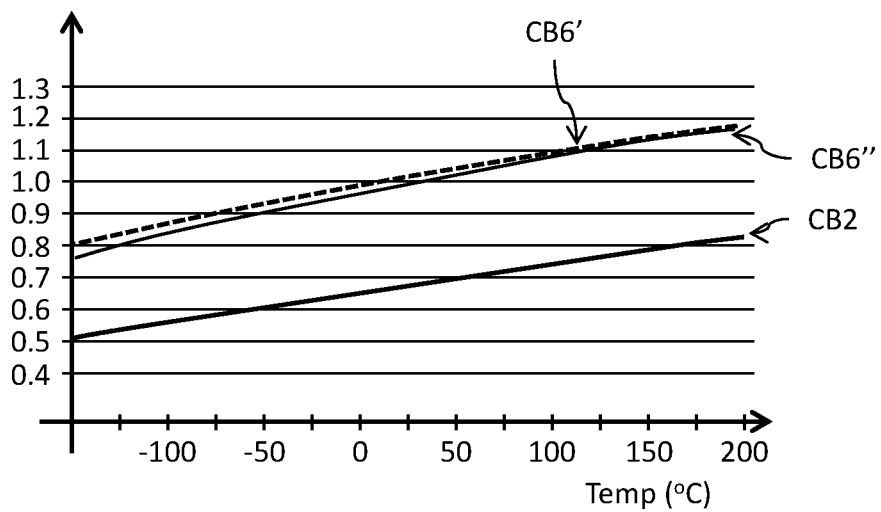

FIGS. 16A-16B illustrate operation of the module 3g as a function of the temperature, within a range between −150° C. and 200° C., with VDD=1.2V. The curve CB5″ shows results for implementation of the module 3g at the technology node H9 SOI. The curve CB6″ shows results for implementation of the module 3g at the technology node 65 SOI. For comparison purposes, the curve CB2 for the module 3 and the curves CB5' and CB6' for the module 3d are also shown. It will be noted that there is some improvement in linearity, although not for module 3g implemented the technology node 65 SOI. The module 3g is accordingly an improvement over the module 3d and is useful in some device applications.

Figure 17:
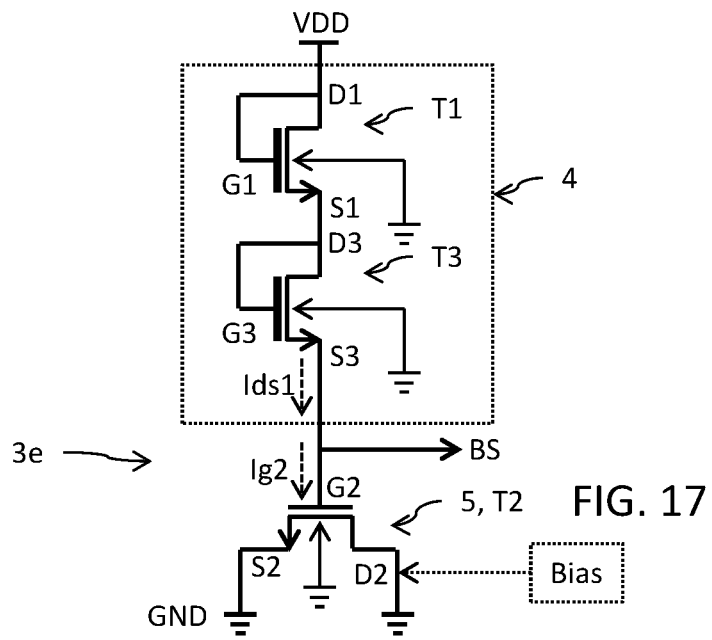
FIG. 17 is a circuit diagram for an embodiment of a temperature sensing circuit module.

In connection with fabrication of the circuit module for a bulk semiconductor substrate technology node, FIG. 17 shows a circuit diagram for an embodiment of a temperature sensing circuit module 3h. In this embodiment, the thermistor 4 is implemented using the transistor T1 coupled in series with a transistor T3 (comprising, for example, an NMOS transistor) having a source S3 that is coupled to the output terminal BS of the circuit module 3 and a drain D3 and a gate G3 that are electrically shorted to each other and coupled to the source S1 of transistor T1. The transistors T1, T2 and T3 are each supported by a bulk semiconductor (for example, silicon) substrate (see, FIG. 3A). In this implementation, there are no back gates for the transistors T1, T2 and T3. The body (bulk) of the transistor T1 is directly electrically connected to the ground voltage GND, the body (bulk) of the transistor T2 is also directly electrically connected to the ground voltage GND and the body (bulk) of the transistor T3 is directly electrically connected to the ground voltage GND. Additionally, the transistors T1 and T3 are fabricated to have a thicker gate oxide. For example, the gate oxide of transistors T1 and T3 in the module 3h have thicknesses of about 5 nm, while the gate oxide of transistor T1 in the module 3e has a thickness of 1.7-1.8 nm. Increasing the thickness of the gate oxide of transistors T1 and T3 has the effect of improving the gate-body (GB) and drain-body (DB) leakage and sub-threshold voltage performance.

In an alternative implementation shown by dotted lines, the drain D2 of the second transistor T2 may instead be coupled to a supply (bias) voltage, (for example, 1.0V) instead of to the ground voltage GND. This implementation is made at the expense of an increase in the power consumption of the second transistor T2, and thus may be undesirable in some circuit implementations.

Figure 18:
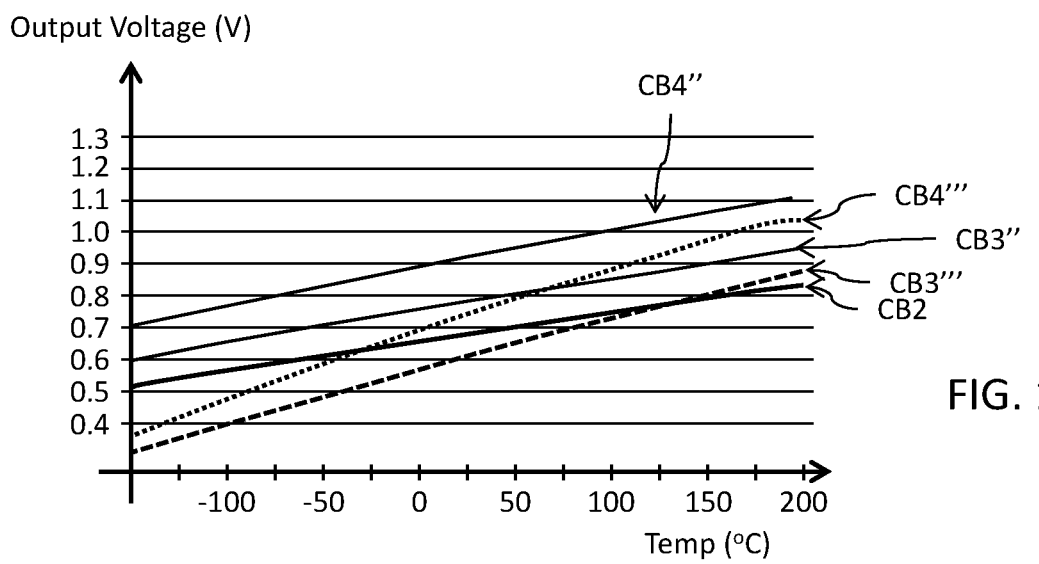
FIG. 18 illustrates operation of the temperature sensing circuit module of FIG. 17 as a function of voltage versus temperature.

FIG. 18 illustrates operation of the module 3h as a function of the temperature, within a range between −150° C. and 200° C. The curve CB3‴ shows results for implementation of the module 3h at the technology node 40 bulk, with VDD=1.1V. The curve CB4‴ shows results for implementation of the module 3h at the technology node 65 bulk, with VDD=1.2V. For comparison purposes, the curve CB2 for module 3 and the curves CB3″ and CB4″ for module 3e are also shown. It will be noted that there is some improvement in slope, however, the curve CB4‴ shows an increase in the square coefficient of the second order polynomial trend line. The module 3h is accordingly an improvement over the module 3e and is useful in some device applications.

Figure 19:
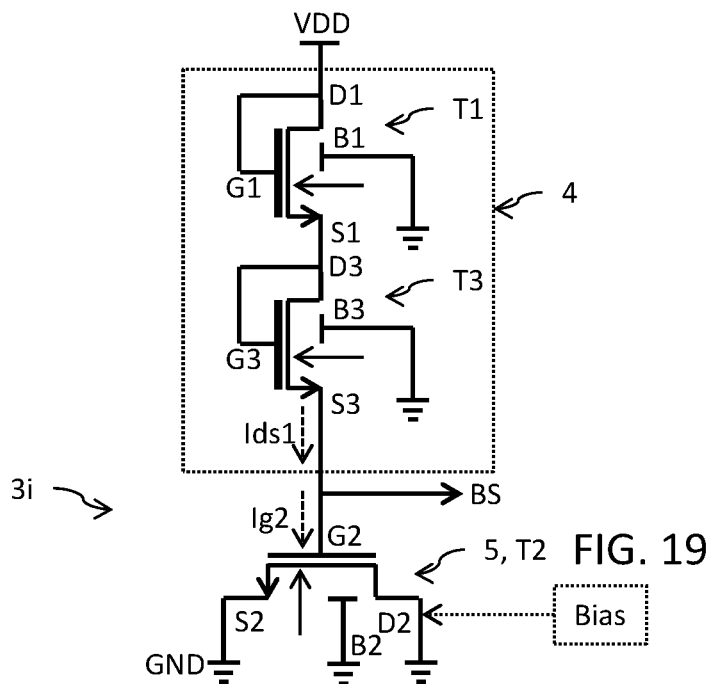
FIG. 19 is a circuit diagram for an embodiment of a temperature sensing circuit module.

In connection with fabrication of the circuit module for a fully depleted semiconductor on insulator (FD-SOI) substrate technology node, FIG. 19 shows a circuit diagram for an embodiment of a temperature sensing circuit module 3i. In this embodiment, the thermistor 4 is implemented using the transistor T1 coupled in series with a transistor T3 (comprising, for example, an NMOS transistor) having a source S3 that is coupled to the output terminal BS of the circuit module 3 and a drain D3 and a gate G3 that are electrically shorted to each other and coupled to the source S1 of transistor T1. The transistors T1, T2 and T3 are each supported by a FD-SOI substrate (see, FIG. 1A). In this implementation, the back gates B1, B2 and B3 for the transistors T1, T2 and T3, respectively, are directly electrically connected to the ground voltage GND. Furthermore, the body (i.e., the channel region of the semiconductor film layer) of the transistor T1, the body (i.e., the channel region of the semiconductor film layer) of the transistor T2 and the body (i.e., the channel region of the semiconductor film layer) of the transistor T3 are left floating. In addition, the transistors T1 and T3 are fabricated to have a thicker gate oxide. For example, the gate oxide of transistors T1 and T3 in the module 3i have thicknesses of about 5 nm, while the gate oxide of transistor T1 in the module 3c has a thickness of about 1.5 nm. Increasing the thickness of the gate oxides of transistors T1 and T3 has the effect of improving the gate-body (GB) and drain-body (DB) leakage and sub-threshold voltage performance.

In an alternative implementation shown by dotted lines, the drain D2 of the second transistor T2 may instead be coupled to a supply (bias) voltage, (for example, 1.0V) instead of to the ground voltage GND. This implementation is made at the expense of an increase in the power consumption of the second transistor T2, and thus may be undesirable in some circuit implementations.

Figure 20:
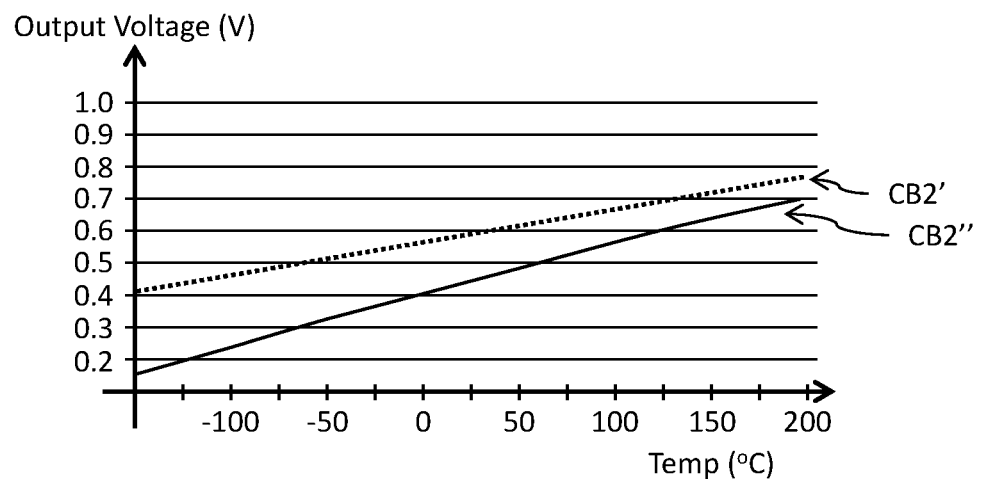
FIG. 20 illustrates operation of the temperature sensing circuit module of FIG. 19 as a function of voltage versus temperature.

FIG. 20 illustrates operation of the module 3i as a function of the temperature, within a range between −150° C. and 200° C., with VDD=0.9V. The curve CB2″ shows results for implementation of the module 3i. For comparison purposes, the curve CB2' for the operation of module 3f is also shown. It will be noted that module 3i exhibits substantially the same linearity with a slight improvement (i.e., increase) in slope. The module 3i is accordingly an improvement over the module 3f.

Figure 21:
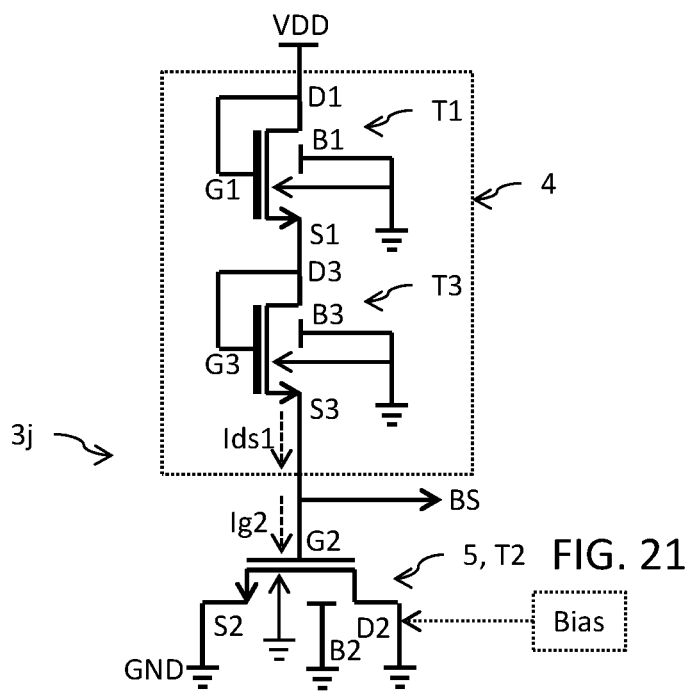
FIG. 21 is a circuit diagram for an embodiment of a temperature sensing circuit module.

In connection with fabrication of the circuit module for a partially depleted semiconductor on insulator (PD-SOI) substrate technology node, FIG. 21 shows a circuit diagram for an embodiment of a temperature sensing circuit module 3j. In this embodiment, the thermistor 4 is implemented using the transistor T1 coupled in series with a transistor T3 (comprising, for example, an NMOS transistor) having a source S3 that is coupled to the output terminal BS of the circuit module 3 and a drain D3 and a gate G3 that are electrically shorted to each other and coupled to the source S1 of transistor T1. The transistors T1, T2 and T3 are each supported by a PD-SOI substrate (see, FIG. 1A). In this implementation, the back gates B1, B2 and B3 for the transistors T1, T2 and T3, respectively, are directly electrically connected to the ground voltage GND. Furthermore, the body (i.e., the channel region of the semiconductor film layer) of the transistor T1, the body (i.e., the channel region of the semiconductor film layer) of the transistor T2, and the body (i.e., the channel region of the semiconductor film layer) of the transistor T3 are also directly electrically connected to the ground voltage GND. In addition, the transistors T1 and T3 are fabricated to have a thicker gate oxide. For example, the gate oxide of transistors T1 and T3 in the module 3*j* have thicknesses of about 5 nm, while the gate oxide of transistor T1 in the module 3*d* has a thickness of 1.8-2 nm. Increasing the thickness of the gate oxide of transistors T1 and T3 has the effect of improving the gate-body (GB) and drain-body (DB) leakage and sub-threshold voltage performance.

In an alternative implementation shown by dotted lines, the drain D2 of the second transistor T2 may instead be coupled to a supply (bias) voltage, (for example, 1.0V) instead of to the ground voltage GND. This implementation is made at the expense of an increase in the power consumption of the second transistor T2, and thus may be undesirable in some circuit implementations.

Figure 22A:
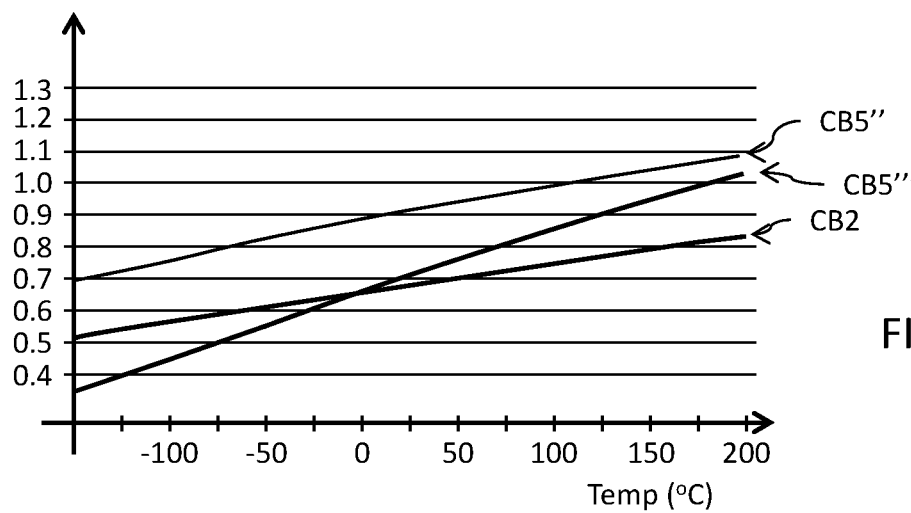
FIGS. 22A-22B illustrate operation of the temperature sensing circuit module of FIG. 21 as a function of voltage versus temperature.
Figure 22B:
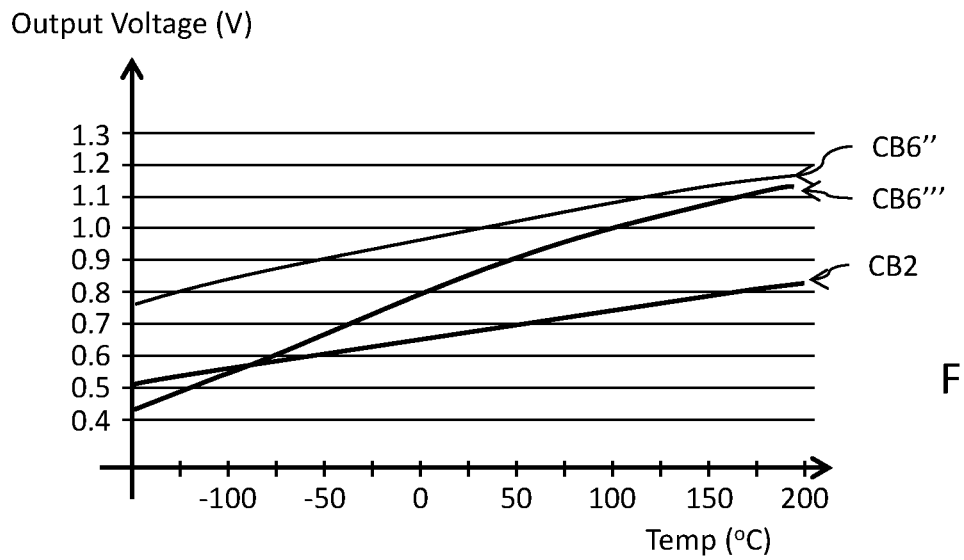

FIGS. 22A-22B illustrate operation of the module 3*j* as a function of the temperature, within a range between −150° C. and 200° C., with VDD=1.2V. The curve CB5''' shows results for implementation of the module 3*j* at the technology node H9 SOI. The curve CB6''' shows results for implementation of the module 3*j* at the technology node 65 SOI. For comparison purposes, the curve CB2 for module 3 and the curves CB5'' and CB6'' for module 3*g* are also shown. It will be noted that there is some improvement in slope, however, the curve CB5''' and CB6''' show an increase in the square coefficient of the second order polynomial trend line. The module 3*j* is accordingly an improvement over the module 3*g* and is useful in some device applications.

To summarize in terms of best circuit module for each technology node:

a) for the technology node 40 bulk, the module 3*e* provides the best linearity, while the module 3*h* provides acceptable linearity with increased slope (to support better precision);

b) for the technology node 65 bulk, the module 3*e* provides the best linearity, while the module 3*h* provides acceptable linearity with increased slope (to support better precision);

c) for the technology node 65 SOI, the module 3*d* provides the best linearity, while the module 3*j* provides acceptable linearity with increased slope (to support better precision);

d) for the technology node H9 SOI, the module 3*e* provides the best linearity, but the module 3*h* provides acceptable linearity with increased slope (to support better precision); and e) for the technology node 28 FD-SOI, the module 3*i* provides the best performance in terms of both linearity and increased slope.

Figure 23:
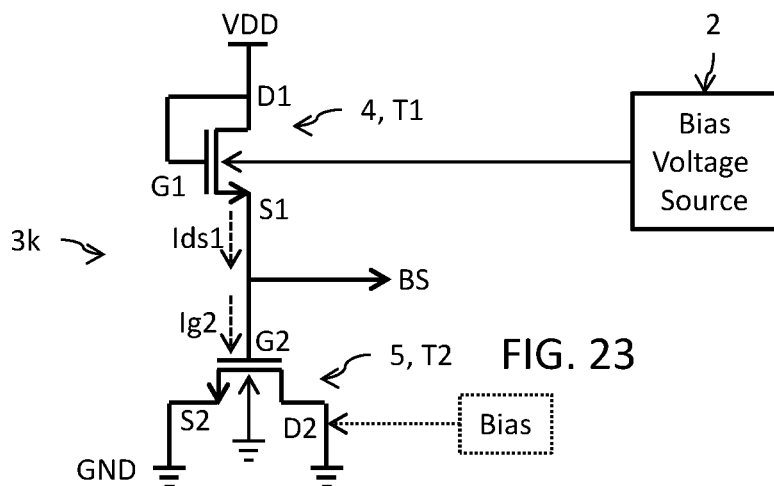
FIG. 23 is a circuit diagram for an embodiment of a temperature sensing circuit module.
Figure 24:
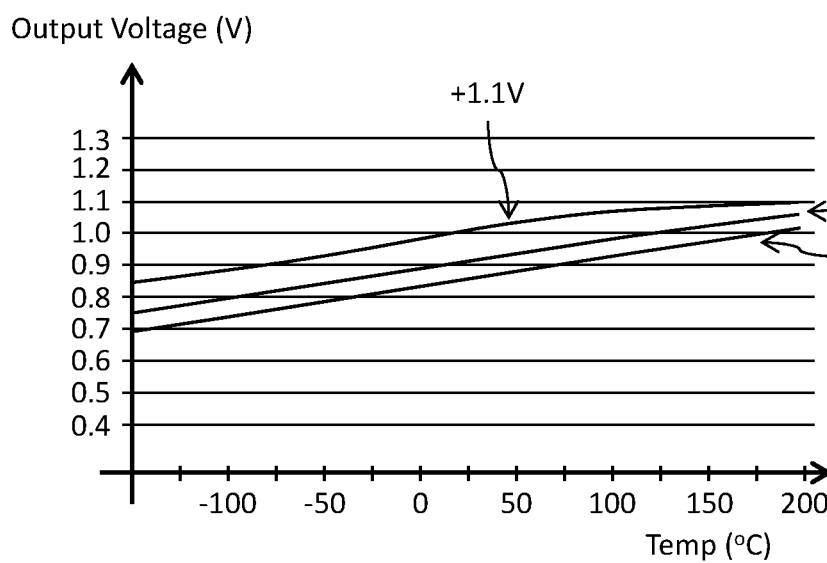
FIGS. 24-25 illustrate operation of the temperature sensing circuit module of FIG. 23 as a function of voltage versus temperature and in response to a controlled body bias voltage.
Figure 25:
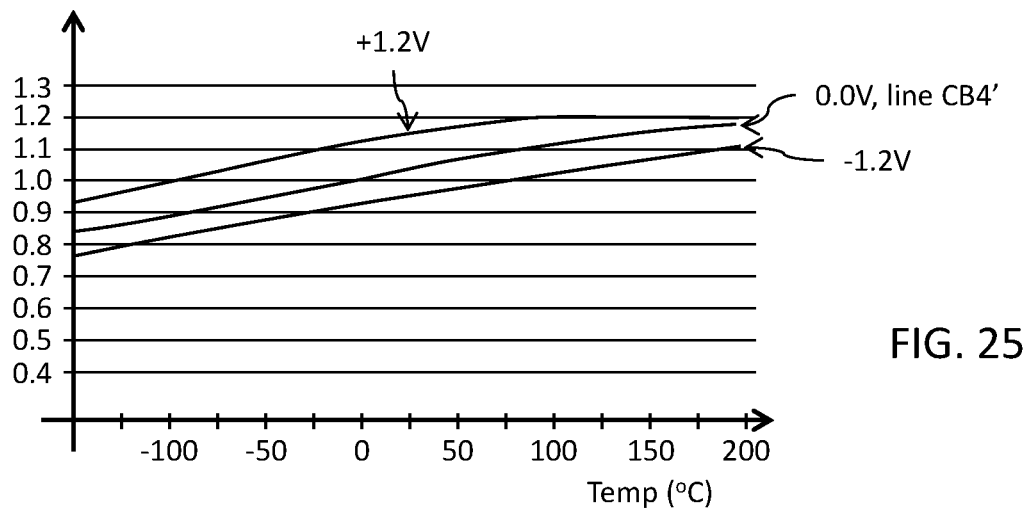

Reference is now made to FIG. 23 which shows a circuit diagram for an embodiment of a temperature sensing circuit module 3*k*. The module 3*k* is substantially the same as the module 3*c* of FIG. 7 except that the body (bulk) of the transistor T1 receives a bias voltage VB # generated by a bias voltage source 2 (instead of being connected to ground). The bias voltage source 2 is configured to generate the bias voltage VB # over a range of bias voltages; for example, from −1.1 V to +1.1 V for implementation at the technology node 40 bulk, and from −1.2 V to +1.2 V for implementation at the technology node 65 bulk. With respect to implementation of the module 3*k* at the technology node 40 bulk, FIG. 24 shows the effect that varying the bias voltage VB # has on the operation of the module 3*k* as a function of the temperature. With respect to implementation of the module 3*k* at the technology node 65 bulk, FIG. 25 shows the effect that varying the bias voltage VB # has on the operation of the module 3*k* as a function of the temperature. It will be noted that the application of certain voltage values for the bias voltage VB # can produce a more linear voltage versus current response of the module 3*k* and additionally shift the range of the output voltage.

Figure 26:
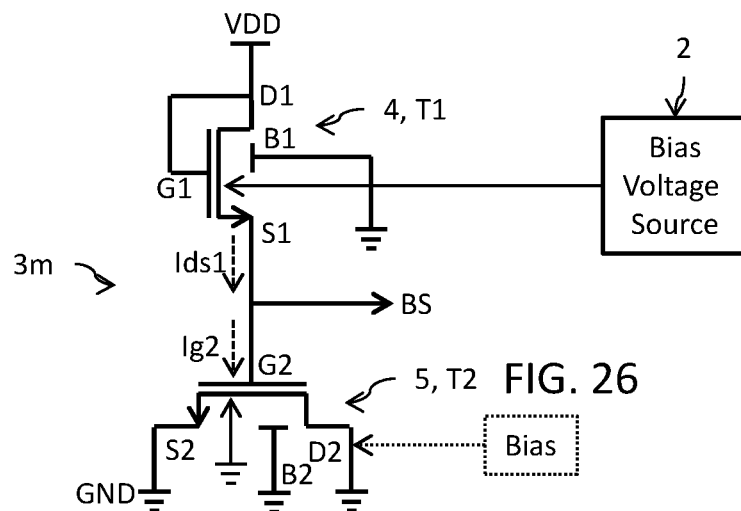
FIG. 26 is a circuit diagram for an embodiment of a temperature sensing circuit module.
Figure 27:
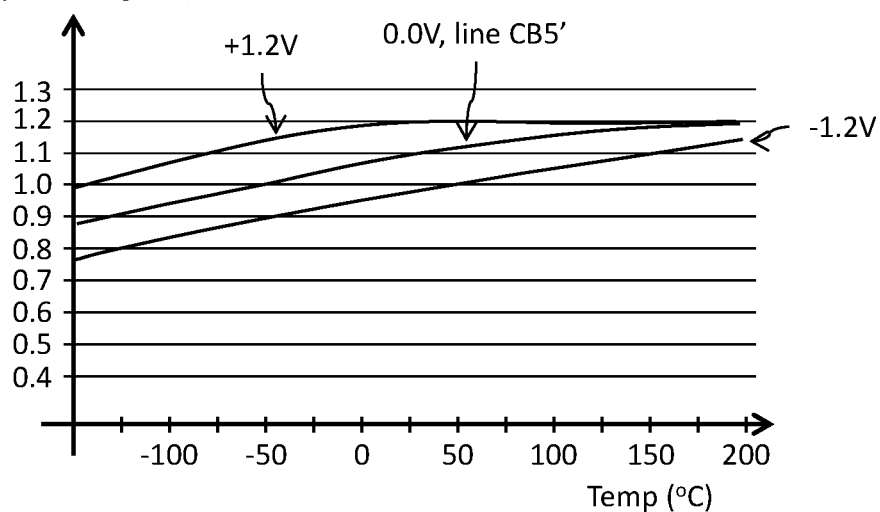
FIGS. 27-28 illustrate operation of the temperature sensing circuit module of FIG. 26 as a function of voltage versus temperature and in response to a controlled body bias voltage.
Figure 28:
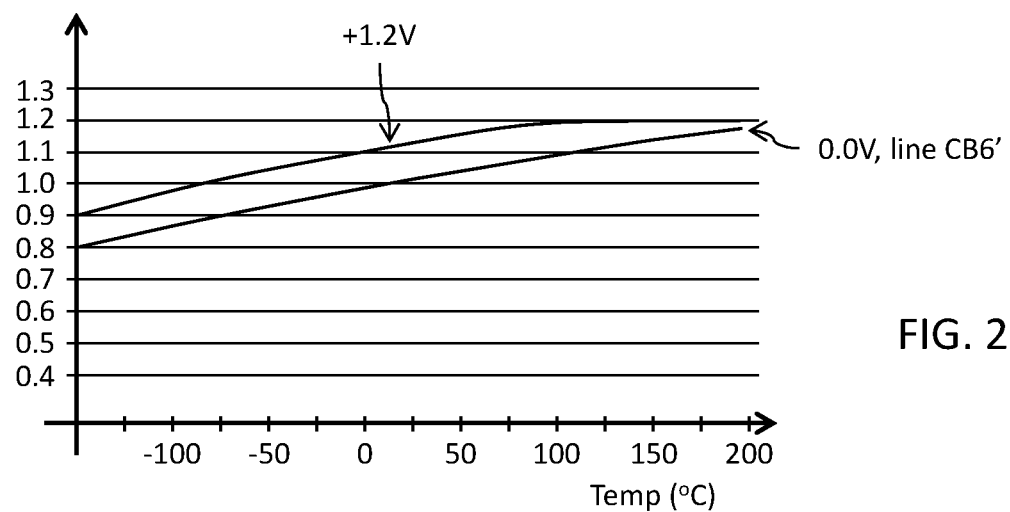

Reference is now made to FIG. 26 which shows a circuit diagram for an embodiment of a temperature sensing circuit module 3*m*. The module 3*m* is substantially the same as the module 3*d* of FIG. 9 except that the body of the transistor T1 receives a bias voltage VB # generated by a bias voltage source 2 (instead of being connected to ground). The bias voltage source 2 is configured to generate the bias voltage VB # over a range of bias voltage from −1.2 V to +1.2 V. With respect to implementation of the module 3*m* at the technology node H9 SOI, FIG. 27 shows the effect that varying the bias voltage VB # has on the operation of the module 3*m* as a function of the temperature. With respect to implementation of the module 3*m* at the technology node 65 SOI, FIG. 28 shows the effect that varying the bias voltage VB # has on the operation of the module 3*m* as a function of the temperature. It will be noted that the application of certain voltage values for the bias voltage VB # can produce a more linear voltage versus current response of the module 3*m* and additionally shift the range of the output voltage. It will further be noted that there is no change in performance for negative values of the bias voltage VB # in FIG. 28 (i.e., the performance for negative values is substantially the same as the performance for VB #=0.0V).

Figure 29:
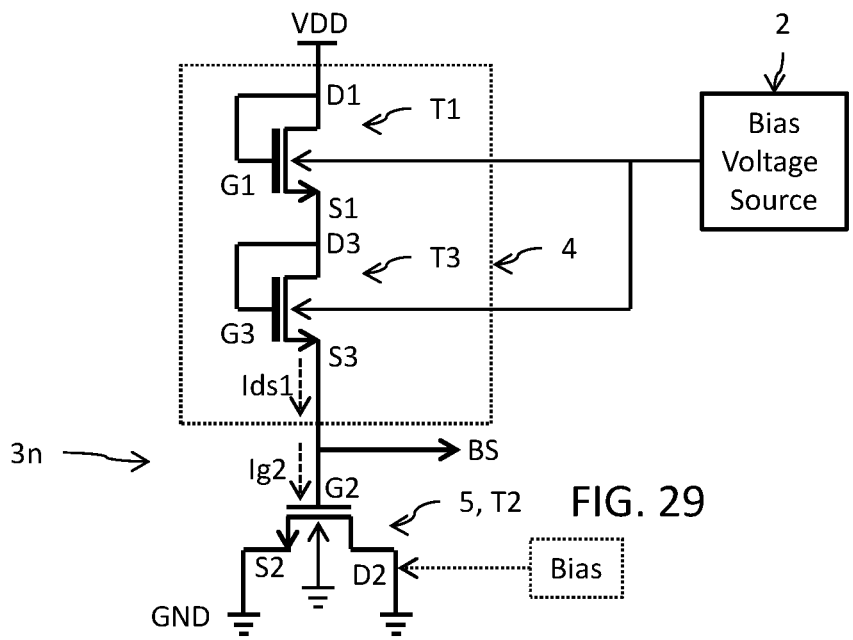
FIG. 29 is a circuit diagram for an embodiment of a temperature sensing circuit module.
Figure 30:
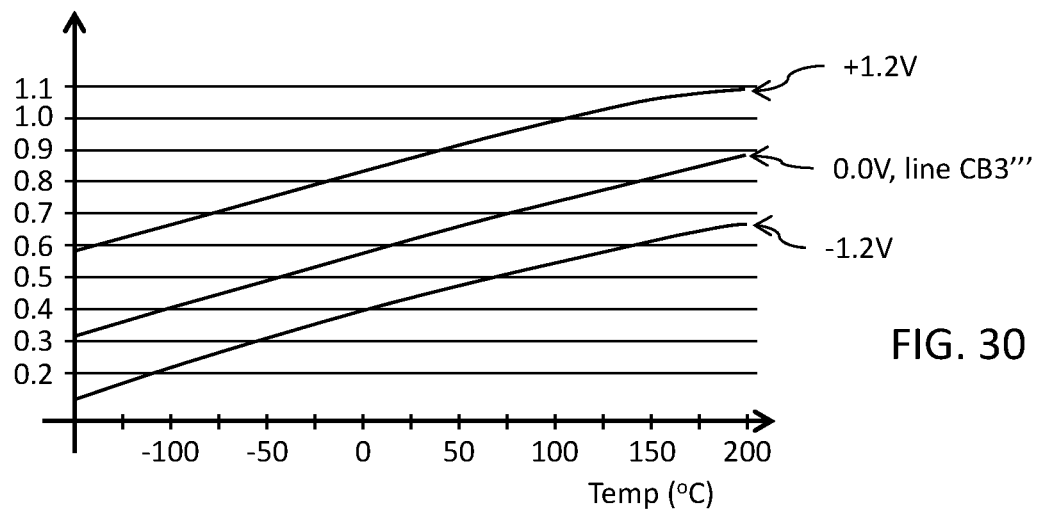
FIGS. 30-31 illustrate operation of the temperature sensing circuit module of FIG. 29 as a function of voltage versus temperature and in response to a controlled body bias voltage.
Figure 31:
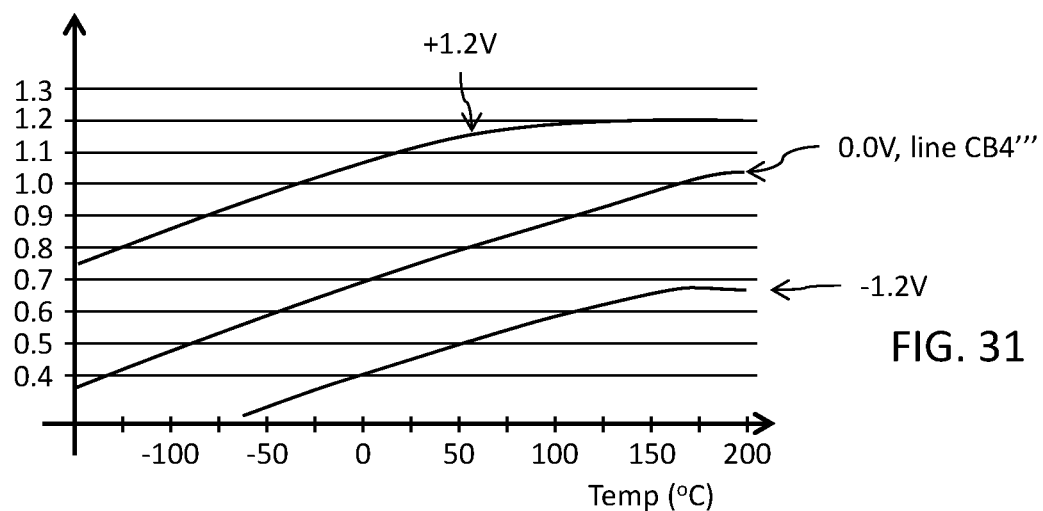

Reference is now made to FIG. 29 which shows a circuit diagram for an embodiment of a temperature sensing circuit module 3*n*. The module 3*n* is substantially the same as the module 3*h* of FIG. 17 except that the body of each of the transistors T1 and T3 receives a bias voltage VB # generated by a bias voltage source 2 (instead of being connected to ground). The bias voltage source 2 is configured to generate the bias voltage VB # over a range of bias voltage; for example, from −1.1 V to +1.1 V for implementation at the technology node 40 bulk, and from −1.2 V to +1.2 V for implementation at the technology node 65 bulk. With respect to implementation of the module 3*n* at the technology node 40 bulk, FIG. 30 shows the effect that varying the bias voltage VB # has on the operation of the module 3*n* as a function of the temperature. With respect to implementation of the module 3*n* at the technology node 65 bulk, FIG. 31 shows the effect that varying the bias voltage VB # has on the operation of the module 3*n* as a function of the temperature. It will be noted that the application of certain voltage values for the bias voltage VB # can produce a more linear voltage versus current response of the module 3*n* and additionally shift the range of the output voltage.

Figure 32:
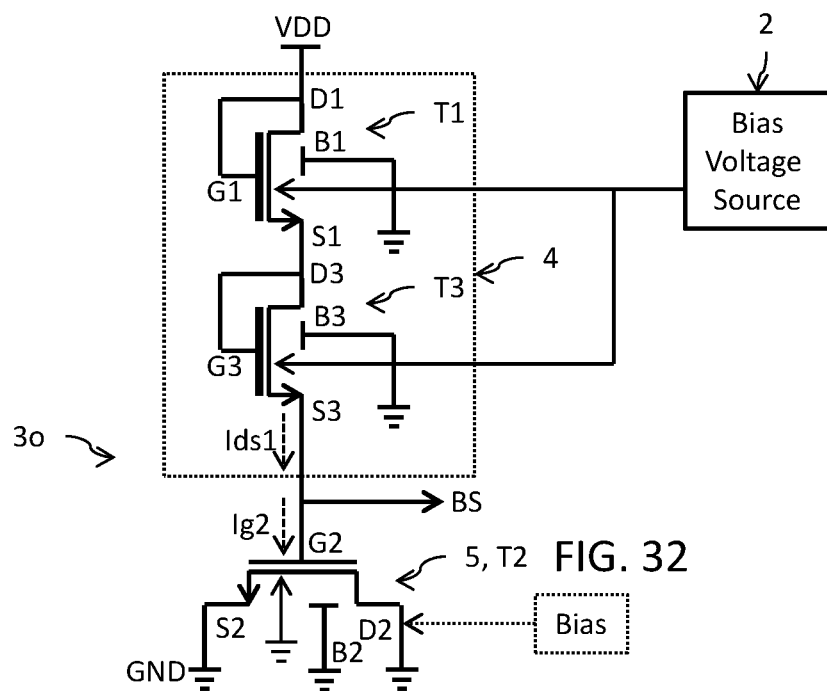
FIG. 32 is a circuit diagram for an embodiment of a temperature sensing circuit module.
Figure 33:
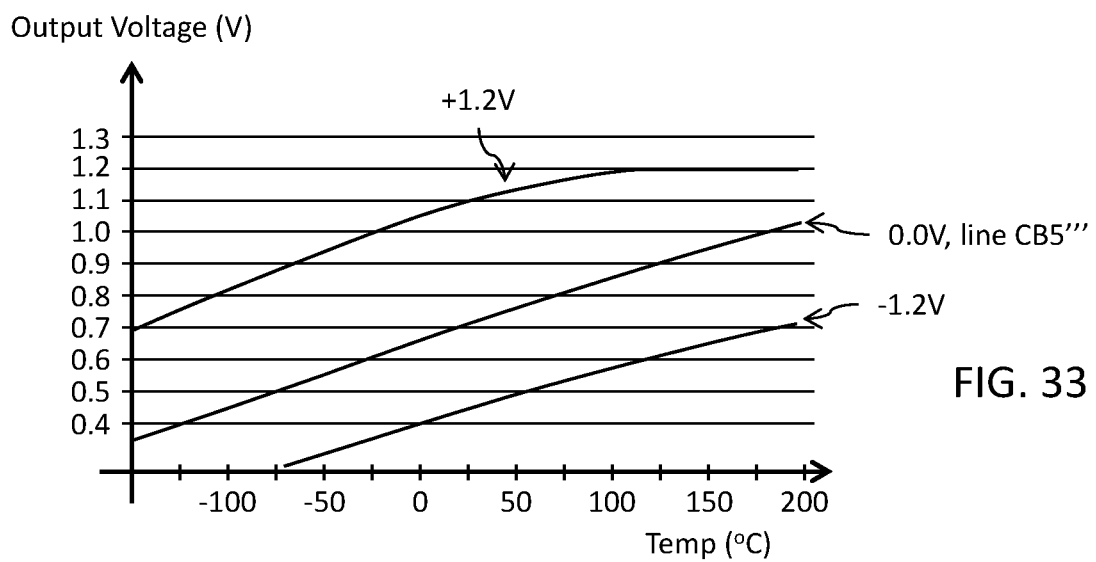
FIGS. 33-34 illustrate operation of the temperature sensing circuit module of FIG. 32 as a function of voltage versus temperature and in response to a controlled body bias voltage.
Figure 34:
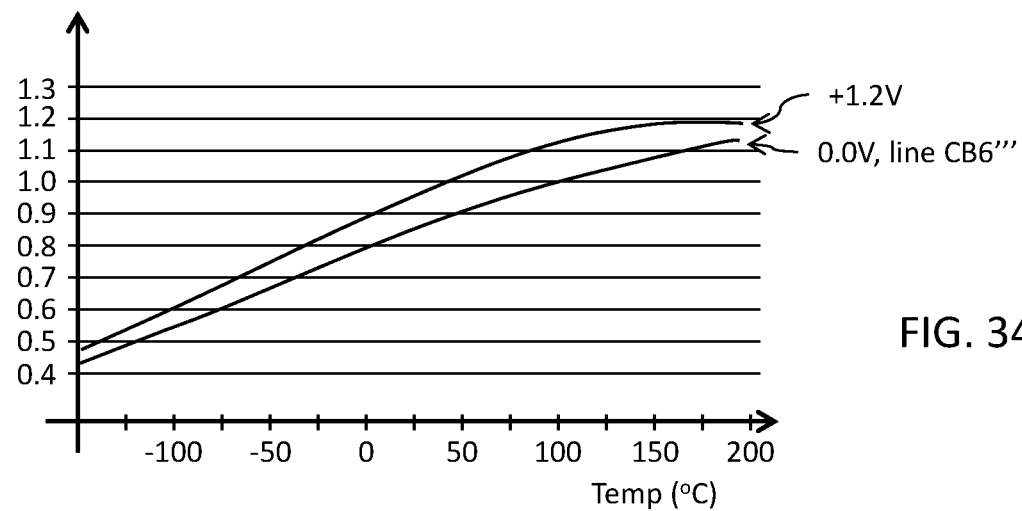

Reference is now made to FIG. 32 which shows a circuit diagram for an embodiment of a temperature sensing circuit module 3*o*. The module 3*o* is substantially the same as the module 3*j* of FIG. 21 except that the body of the transistors T1 and T3 receives a bias voltage VB # generated by a bias voltage source 2 (instead of being connected to ground). The bias voltage source 2 is configured to generate the bias voltage VB # over a range of bias voltage from −1.2 V to +1.2 V. With respect to implementation of the module 3*o* at the technology node H9 SOI, FIG. 33 shows the effect that varying the bias voltage VB # has on the operation of the module 3*o* as a function of the temperature. With respect to implementation of the module 3*o* at the technology node 65 SOI, FIG. 34 shows the effect that varying the bias voltage VB # has on the operation of the module 3*o* as a function of the temperature. It will be noted that the application of certain voltage values for the bias voltage VB # can produce a more linear voltage versus current response of the module 3*o* and additionally shift the range of the output voltage. It will further be noted that there is no change in performance for negative values of the bias voltage VB # in FIG. 34 (i.e., the performance for negative values is substantially the same as the performance for VB #=0.0V.

Figure 35:
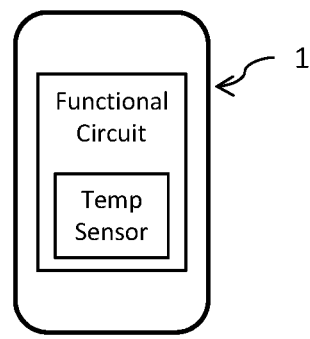
FIG. 35 illustrates an electronic appliance with a temperature sensing circuit module.

Reference 1 in FIG. 35 denotes an electronic appliance, in this case, for example, a cellular mobile telephone designed to withstand extreme environmental conditions, such as a significant temperature variation.

The electronic appliance 1 includes functional circuitry (for example, for implementing processing, communications, display, interface, etc. functions) wherein the functional circuitry includes a temperature sensor in the form of one of the circuit modules 3c-3o as described above.

In the context herein, the terms "substantially" or "about" will be understood to mean within ±5% of an indicated value.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

The invention claimed is:

1. A temperature sensing circuit, comprising:
a thermistor comprising a first MOS transistor having a first drain, a first source, a first gate, a first body and a first back gate, wherein the first MOS transistor is configured to operate in weak inversion mode with a negative temperature coefficient drain-source resistance;
an output terminal coupled to the first source and configured to generate a positive temperature coefficient output voltage; and
a current source comprising a second MOS transistor having a second drain, a second source, a second gate, a second body and a second back gate, wherein the second gate is coupled to the first source and configured to impose a drain-source current of the first MOS transistor; and
wherein the first body and second body are floating, and wherein the first back gate and the second back gate are directly electrically connected to a ground node.

2. The temperature sensing circuit of claim 1, wherein the first and second MOS transistors are supported by a semiconductor on insulator (SOI) substrate, said SOI substrate including semiconductor film layer over a buried oxide layer over a semiconductor substrate, and wherein the semiconductor film layer provides the first and second bodies and wherein the first and second back gates are provided within the semiconductor substrate.

3. The temperature sensing circuit of claim 2, wherein the SOI substrate is a fully depleted SOI substrate.

4. The temperature sensing circuit of claim 1, wherein the first drain is directly electrically connected to a supply voltage node.

5. The temperature sensing circuit of claim 1, wherein the second source and second drain are directly electrically connected to the ground node.

6. The temperature sensing circuit of claim 1, wherein the second source is directly electrically connected to the ground node and the second drain is configured to receive a bias voltage.

7. The temperature sensing circuit of claim 1, wherein the first gate is directly electrically connected to the first drain.

8. The temperature sensing circuit of claim 1, wherein the first gate of the first MOS transistor has a first gate oxide thickness, and wherein the second gate of the second MOS transistor has a second gate oxide thickness, and wherein the first gate oxide thickness is thicker than the second gate oxide thickness.

9. The temperature sensing circuit of claim 8, wherein the first and second MOS transistors are supported by a semiconductor on insulator (SOI) substrate, said SOI substrate including semiconductor film layer over a buried oxide layer over a semiconductor substrate, and wherein the semiconductor film layer provides the first and second bodies and wherein the first and second back gates are provided within the semiconductor substrate.

10. The temperature sensing circuit of claim 9, wherein the SOI substrate is a fully depleted SOI substrate.

11. The temperature sensing circuit of claim 8, wherein the first drain is directly electrically connected to a supply voltage node.

12. The temperature sensing circuit of claim 8, wherein the second source and second drain are directly electrically connected to the ground node.

13. The temperature sensing circuit of claim 8, wherein the second source is directly electrically connected to the ground node and the second drain is configured to receive a bias voltage.

14. The temperature sensing circuit of claim 8, wherein the first gate is directly electrically connected to the first drain.

15. The temperature sensing circuit of claim 1, wherein the thermistor further comprises:
a third MOS transistor having a third drain which is coupled to the first source, a third source coupled to the output terminal, a third gate, a third body and a third back gate, wherein the third MOS transistor is configured to operate in weak inversion mode with a negative temperature coefficient drain-source resistance; and
wherein the third body is floating, and
wherein the third back gate is directly electrically connected to the ground node.

16. The temperature sensing circuit of claim 15, wherein the first, second and third MOS transistors are supported by a semiconductor on insulator (SOI) substrate, said SOI substrate including semiconductor film layer over a buried oxide layer over a semiconductor substrate, and wherein the semiconductor film layer provides the first, second and third second bodies and wherein the first, second and third back gates are provided within the semiconductor substrate.

17. The temperature sensing circuit of claim 16, wherein the SOI substrate is a fully depleted SOI substrate.

18. The temperature sensing circuit of claim 15, wherein the first drain is directly electrically connected to a supply voltage node.

19. The temperature sensing circuit of claim 15, wherein the second source and second drain are directly electrically connected to the ground node.

20. The temperature sensing circuit of claim 15, wherein the second source is directly electrically connected to the ground node and the second drain is configured to receive a bias voltage.

21. The temperature sensing circuit of claim 15, wherein the first gate is directly electrically connected to the first drain and wherein the third gate is directly electrically connected to the third drain.

22. The temperature sensing circuit of claim 15, wherein the first gate of the first MOS transistor has a first gate oxide thickness, wherein the second gate of the second MOS transistor has a second gate oxide thickness, wherein the third gate of the third MOS transistor has a third gate oxide thickness, and wherein the first and third gate oxide thicknesses are thicker than the second gate oxide thickness.

\* \* \* \* \*